United States Patent
Matsui et al.

(10) Patent No.: US 8,115,222 B2
(45) Date of Patent: Feb. 14, 2012

(54) SEMICONDUCTOR LIGHT EMITTING DEVICE AND FABRICATION METHOD FOR THE SEMICONDUCTOR LIGHT EMITTING DEVICE

(75) Inventors: Nobuaki Matsui, Kyoto (JP); Yasuo Nakanishi, Kyoto (JP)

(73) Assignee: Rohm Co., Ltd. (JP)

( * ) Notice: Subject to any disclaimer, the term of this patent is extended or adjusted under 35 U.S.C. 154(b) by 424 days.

(21) Appl. No.: 12/318,831

(22) Filed: Jan. 9, 2009

(65) Prior Publication Data
US 2009/0179215 A1    Jul. 16, 2009

(30) Foreign Application Priority Data

Jan. 16, 2008 (JP) .................................. 2008-007130
Dec. 4, 2008 (JP) .................................. 2008-309420

(51) Int. Cl.
*H01L 33/00* (2010.01)
(52) U.S. Cl. ...................... 257/98; 257/E33.064; 438/29
(58) Field of Classification Search ............ 257/79–102, 257/E33.001, E33.055, E33.062, E33.063, 257/E33.064, E33.065; 438/22–47
See application file for complete search history.

(56) References Cited

U.S. PATENT DOCUMENTS

2009/0108250 A1 * 4/2009 Kim et al. ........................ 257/13

FOREIGN PATENT DOCUMENTS

| JP | 2697572 | 4/1995 |
|----|---------|--------|
| JP | 10-284802 | 10/1998 |
| JP | 2001-345480 | 12/2001 |
| JP | 2004-055719 | 2/2004 |

* cited by examiner

*Primary Examiner* — Ha Tran T Nguyen
*Assistant Examiner* — Kevin Quinto
(74) *Attorney, Agent, or Firm* — Rabin & Berdo, PC

(57) ABSTRACT

A semiconductor light emitting device includes a first metal layer placed on the p-type semiconductor layer on the substrate, and includes a first pattern width W1; a second metal layer on the first metal layer; a transparent electrode layer on the second metal layer and the p type semiconductor layer, and has an opening patterned with a second pattern width W2 on the second metal layer; an insulating film the transparent electrode layer and the second metal layer, and has an opening patterned with third pattern width W3 on the second metal layer; a reflective stacked film on the insulating film, and has an opening patterned with third pattern width W3 on the second metal layer; a third metal layer on the second metal layer of an opening patterned with the reflective stacked film and third pattern width W3; and a fourth metal layer on the third metal layer.

27 Claims, 18 Drawing Sheets

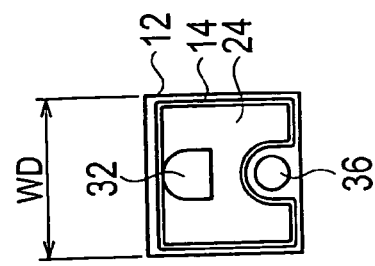
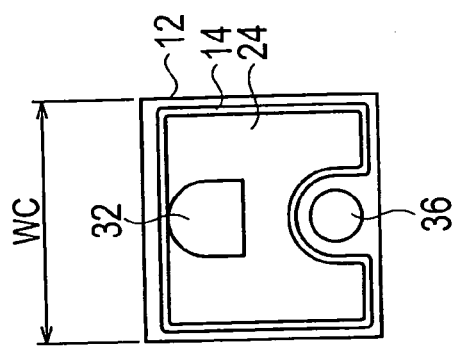
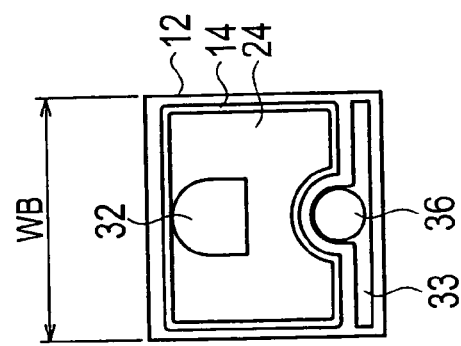
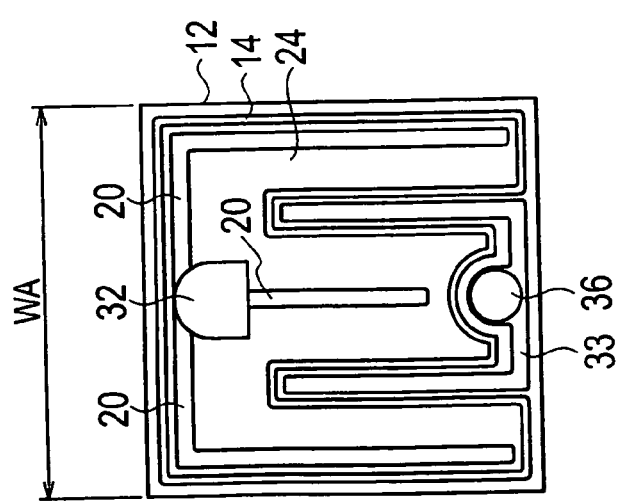

SEMICONDUCTOR LIGHT EMITTING DEVICE AND FABRICATION METHOD FOR THE SEMICONDUCTOR LIGHT EMITTING DEVICE

CROSS REFERENCE TO RELATED APPLICATION AND INCORPORATION BY REFERENCE

This application is based upon and claims the benefit of priority from prior Japanese Patent Applications No. P2008-007130 filed on Jan. 16, 2008, and No. P2008-309420 filed on Dec. 4, 2008, the entire contents of which are incorporated herein by reference.

BACKGROUND OF THE INVENTION

1. Field of the Invention

The present invention relates to a semiconductor light emitting device and a fabrication method for the semiconductor light emitting device. In particular, the present invention relates a semiconductor light emitting device and a fabrication method for the semiconductor light emitting device for improving outward luminous efficiency.

2. Description of the Related Art

The semiconductor light emitting device which composes a III group nitride based semiconductor is used for an LED (Light Emitting Diode) etc. As an example of the III group nitride based semiconductor, there are aluminum nitride (AlN), gallium nitride (GaN), indium nitride (InN), etc. A typical III group nitride based semiconductor is expressed with $Al_xIn_yGa_{1-x-y}N$ (where $0<=x<=1$, $0<=y<=1$, $0<=x+y<=1$).

The semiconductor light emitting device using the III group nitride based semiconductor has a structure layered by n-type III group nitride based semiconductor layer (n-type semiconductor layer), active layer (luminous layer), and p-type III group nitride based semiconductor layer (p-type semiconductor layer) on the substrate at this order, for example. And the light to which a hole supplied from the p-type semiconductor layer and an electron supplied from the n-type semiconductor layer recombine and generate in the active layer is outputted external (for example, refer to Patent Documents 1).

As the active layer, an MQW (Multi-Quantum Well) structure which sandwiched a plurality of layer by a well layer in the shape of sandwiches by the barrier layer with a greater band gap than the well layer is adoptable (for example, refer to Patent Documents 2).

On the other hand, a light emitting device for improving an external quantum efficiency of the gallium nitride based compound semiconductor light emitting device which applies a p-type semiconductor layer to the luminescence observation surface side, and for improving reliability by losing removal of a p-side electrode of the p-type semiconductor layer and the electrode for bonding mainly at the time of wire bonding is also disclosed (for example, refer to Patent Document 3).

In order to obtain the large diameter light emitting device from which uniform light emission is obtained, in an element whose maximum outer diameter is not less than 700 micrometers, a III group nitride based compound semiconductor element achieving the distance to the point of the p-side electrode which is most separated from the n-side electrode in within 500 micrometers is also disclosed (for example, refer to Patent Document 4).

Patent Document 1: Japanese Patent Application Laying-Open Publication No. H10-284802

Patent Document 2: Japanese Patent Application Laying-Open Publication No. 2004-55719

Patent Document 3: Japanese Patent Publication No. 2697572

Patent Document 4: Japanese Patent Application Laying-Open Publication No. 2001-345480

SUMMARY OF THE INVENTION

According to one aspect of the present invention, a semiconductor light emitting device comprises a substrate; an n-type semiconductor layer which is placed on the substrate, and is doped with the n-type impurity; an active layer placed on the n-type semiconductor layer; a p-type semiconductor layer which is placed on the active layer, and is doped with the p-type impurity; a first metal layer which is placed on the p-type semiconductor layer, and has a first pattern width; a second metal layer placed on the first metal layer; a transparent electrode layer which is placed on the second metal layer and the p type semiconductor layer, and has an opening patterned with a second pattern width on the second metal layer; an insulating film which is placed on the transparent electrode layer and the second metal layer, and has an opening patterned with the third pattern width on the second metal layer; a third metal layer placed on the second metal layer of an opening patterned with the insulating film and the third pattern width; and a fourth metal layer placed on the third metal layer.

According to another aspect of the present invention, a semiconductor light emitting device comprises a substrate; an n-type semiconductor layer which is placed on the substrate, and is doped with the n-type impurity; an active layer placed on the n-type semiconductor layer; a p-type semiconductor layer which is placed on the active layer, and is doped with the p-type impurity; a first metal layer which is placed on the p-type semiconductor layer, and has a first pattern width; a second metal layer placed on the first metal layer; a first Ni layer placed on the second metal layer; a transparent electrode layer which is placed on the first metal layer and the p-type semiconductor layer, and has an opening patterned with a second pattern width on the first metal layer; an insulating film which is placed on the transparent electrode layer and the first Nil layer, and has an opening patterned with third pattern width on the first Ni layer; a third metal layer placed on the first Ni layer of an opening patterned with the insulating film and the third pattern width; a second Ni layer placed on the third metal layer; and a fourth metal layer placed on the second Ni layer.

According to another aspect of the present invention, a semiconductor light emitting device comprises a substrate; an n-type semiconductor layer which is placed on the substrate, and is doped with the n-type impurity; an active layer placed on the n-type semiconductor layer; a p-type semiconductor layer which is placed on the active layer, and is doped with the p-type impurity; a first metal layer which is placed on the p-type semiconductor layer, and has a first pattern width; a first Ni layer placed on the first metal layer; a second metal layer placed on the first Ni layer; a transparent electrode layer which is placed on the second metal layer and the p type semiconductor layer, and has an opening patterned with a second pattern width on the second metal layer; an insulating film which is placed on the transparent electrode layer and the second metal layer, and has an opening patterned with third pattern width on the second metal layer; a third metal layer placed on the second metal layer of an opening patterned with the insulating film and the third pattern width; a second Ni layer placed on the third metal layer; and a fourth metal layer placed on the second Ni layer.

According to another aspect of the present invention, a fabrication method for a semiconductor light emitting device comprising forming an n-type semiconductor layer doped with the n-type impurity on a substrate; forming an active layer on the n-type semiconductor layer; forming a p-type semiconductor layer doped with the p-type impurity on the active layer; forming a first metal layer on the p-type semiconductor layer; forming a second metal layer on the first metal layer; patterning the first metal layer and the second metal layer with a first pattern width; forming an opening patterned with a second pattern width on the second metal layer after forming a transparent electrode layer on the second metal layer and the p-type semiconductor layer; forming an insulating film on the transparent electrode layer and the second metal layer; forming an opening having a third pattern width on the second metal layer after patterning the insulating film; forming a third metal layer on the second metal layer of the opening having the third pattern width; and forming a fourth metal layer on the third metal layer.

According to another aspect of the present invention, a fabrication method for a semiconductor light emitting device comprising forming an n-type semiconductor layer doped with the n-type impurity on a substrate; forming an active layer on the n-type semiconductor layer; forming a p-type semiconductor layer doped with the p-type impurity on the active layer; forming a first metal layer on the p-type semiconductor layer; forming a second metal layer on the first metal layer; forming first Ni layer on the second metal layer; patterning the first metal layer, the second metal layer, and the first Ni layer with a first pattern width; forming an opening patterned with a second pattern width on the first Ni layer after forming a transparent electrode layer on the first Ni layer and the p-type semiconductor layer; forming an insulating film on the transparent electrode layer and the first Ni layer; forming an opening having a third pattern width on the first Ni layer after patterning the insulating film; forming a third metal layer on the first Ni layer of the opening having the third pattern width; forming a second Ni layer on the third metal layer; and forming a fourth metal layer on the second Ni layer.

According to another aspect of the present invention, a fabrication method for a semiconductor light emitting device comprising: forming an n-type semiconductor layer doped with the n-type impurity on a substrate; forming an active layer on the n-type semiconductor layer; forming a p-type semiconductor layer doped with the p-type impurity on the active layer; forming a first metal layer on the p-type semiconductor layer; forming a first Ni layer on the first metal layer; forming a second metal layer on the first Ni layer; patterning the first metal layer, the first Ni layer, and the second metal layer with a first pattern width; forming an opening patterned with a second pattern width on the second metal layer after forming a transparent electrode layer on the second metal layer and the p-type semiconductor layer; forming an insulating film on the transparent electrode layer and the second metal layer; forming an opening having a third pattern width on the second metal layer after patterning the insulating film; forming a third metal layer on the second metal layer of the opening having the third pattern width; forming a second Ni layer on the third metal layer; and forming a fourth metal layer on the second Ni layer.

According to the present invention, the semiconductor light emitting device whose manufacturing yield improves and which improves outward luminous efficiency can be provided.

BRIEF DESCRIPTION OF DRAWINGS

FIG. 6A shows a schematic plane pattern configuration by the wire bonding configuration of the semiconductor light emitting device according to the first to the third embodiments of the present invention, and is a schematic plane pattern configuration example of WA=1 mm square.

FIG. 6B shows a schematic plane pattern configuration by the wire bonding configuration of the semiconductor light emitting device according to the first to the third embodiments of the present invention, and is a schematic plane pattern configuration example of WB=0.6 mm square.

FIG. 6C shows a schematic plane pattern configuration by the wire bonding configuration of the semiconductor light emitting device according to the first to the third embodiments of the present invention, and is another schematic plane pattern configuration example of WC=1 mm square.

FIG. 6D shows a schematic plane pattern configuration by the wire bonding configuration of the semiconductor light emitting device according to the first to the third embodiments of the present invention, and is a schematic plane pattern configuration example of WD=0.4 mm square.

DETAILED DESCRIPTION OF THE EMBODIMENTS

Figure 1:
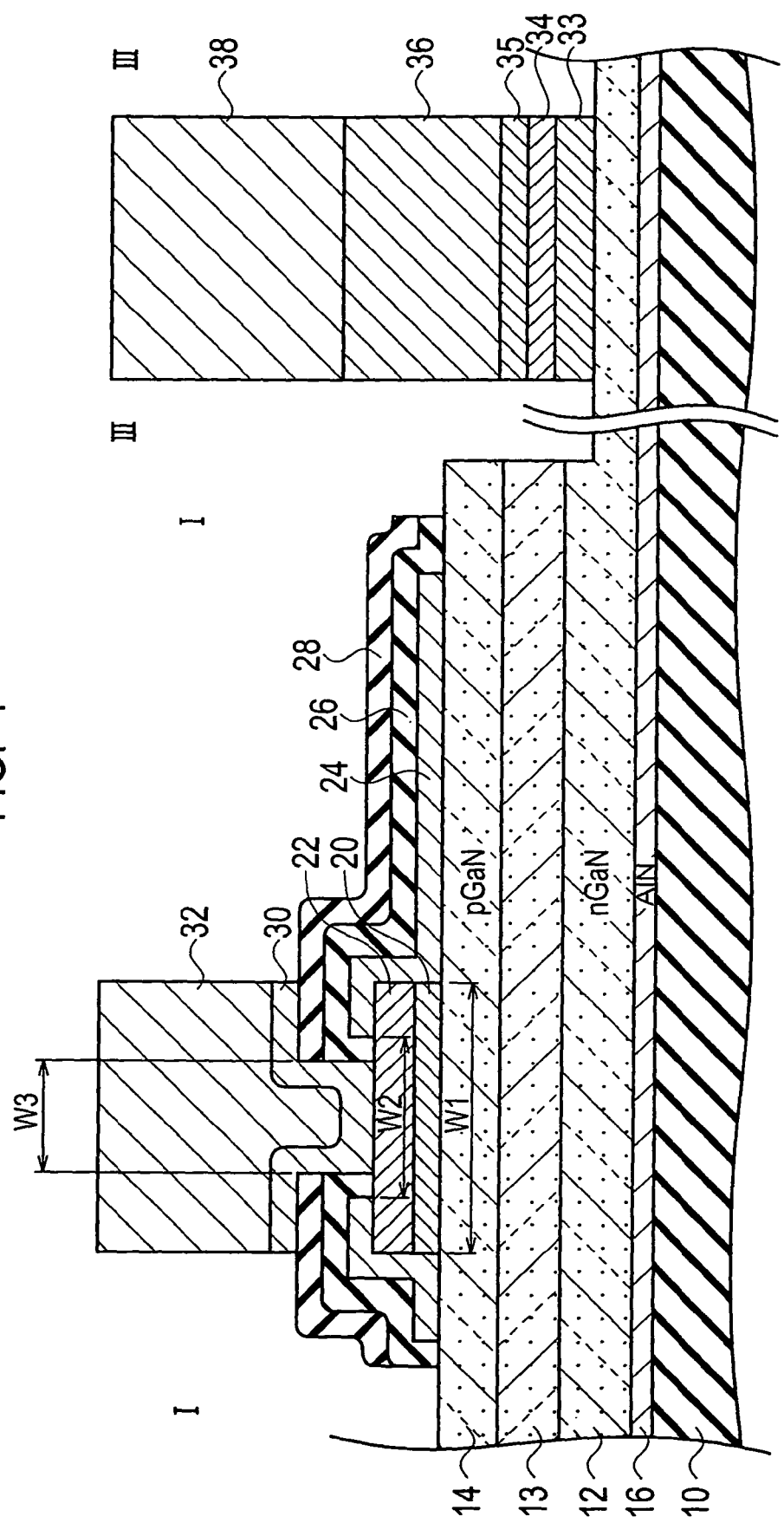
FIG. 1 shows a section structure of a semiconductor light emitting device according to a first embodiment of the present invention, and is a schematic cross-sectional configuration chart taken in the lines I-I and III-III of FIG. 3.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is shown in the representation of the cross-sectional diagram, it will be appreciated that the various drawings are not drawn to scale from one figure to another nor inside a given figure, and in particular that the cross-sectional diagrams are arbitrarily drawn for facilitating the reading of the drawings. In the following descriptions, numerous specific details are set forth such as specific material layers, etc. to provide a thorough understanding of the present invention. However, it will be obvious to those skilled in the art that the present invention may be practiced without such specific details. In other instances, the material layers well-known have been shown in the cross-sectional diagrams form in order to not obscure the present invention with unnecessary detail. Drawings are schematic, not actual, and may be inconsistent in between in scale, ratio, etc.

The embodiments shown below exemplify a semiconductor device that are used to implement the technical ideas according to the present invention, and do not limit the technical ideas according to the present invention to those that appear below. These technical ideas, according to the present invention, may receive a variety of modifications that fall within the claims.

In a semiconductor light emitting device(s) according to the following embodiments of the invention, "transparent" is defined as that whose transmissivity is not less than about 50%. In the semiconductor light emitting device(s) according to the embodiments of the invention, the "transparent" is used for the purpose of being transparent and colorless toward visible light. The visible light is equivalent to the wavelength of about 360 nm to about 830 nm, and about 3.4 eV to about 1.5 eV of energies, and if the visible light does not cause absorption, reflection and dispersion in this region, it is transparent.

The transparency is determined by a band gap $E_g$ and a plasma frequency $\omega_p$. When the band gap $E_g$ is not less than about 3.1 eV, since an inter band transition of an electron does not occur with the visible light, it passes through without absorbing visible light. On the other hand, since the light of energy lower than plasma frequency $\omega_p$ cannot advance into the inside of plasma, it is reflected by the carrier considered that is plasma. The plasma frequency $\omega_p$ is expressed with $\omega_p = (nq^2/\epsilon m^*)^{1/2}$ (where n denotes carrier density, q denotes an electric charge, $\epsilon$ denotes a dielectric constant, and m* denotes effective mass), and is a function of carrier density. and is a function of carrier density.

First Embodiment (Element Structure)

Figure 2:
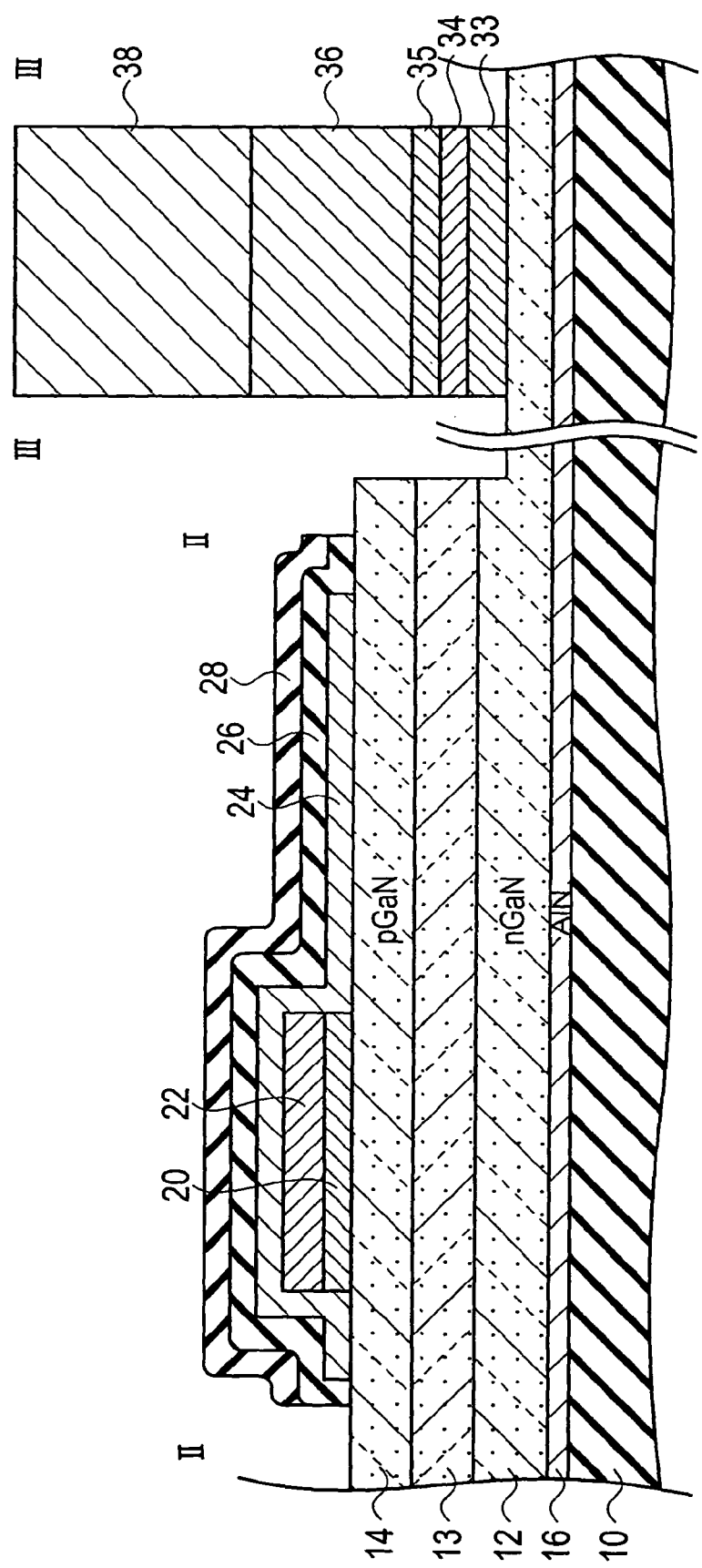
FIG. 2 shows a section structure of the semiconductor light emitting device according to the first embodiment of the present invention, and is a schematic cross-sectional configuration chart taken in the line II-II of FIG. 4, or the line III-III of FIG. 3.

As shown in FIG. 1 to FIG. 2, a semiconductor light emitting device according to a first embodiment of the present invention includes a substrate 10; an n-type semiconductor layer 12 which is placed on the substrate 10, and is doped with the n-type impurity; an active layer 13 placed on the n-type semiconductor layer 12; a p-type semiconductor layer 14 which is placed on the active layer 13, and is doped with the p-type impurity; a first metal layer 20 which is placed on the p-type semiconductor layer 14, and includes a first pattern width W1; a second metal layer 22 placed on the first metal layer 20; a transparent electrode layer 24 which is placed on the second metal layer 22 and the p-type semiconductor layer 14, and has an opening patterned with a second pattern width W2 on the second metal layer 22; an insulating film 26 which is placed on the transparent electrode layer 24 and the second metal layer 22, and has an opening patterned with third pattern width W3 on the second metal layer 22; a reflective stacked film 28 which is placed on the insulating film 26, and has an opening patterned with third pattern width W3 on the second metal layer 22; a third metal layer 30 placed on the second metal layer 22 of an opening patterned with the reflective stacked film 28 and third pattern width W3; and a fourth metal layer 32 placed on the third metal layer 30.

Moreover, as shown in FIG. 1 to FIG. 2, the semiconductor light emitting device according to the first embodiment of the present invention may include: a fifth metal layer 33 placed on the n-type semiconductor layer 12 which removes a part of the p-type semiconductor layer 14, the active layer 13, and the n-type semiconductor layer 12 by etching; a third Ni layer 34 placed on the fifth metal layer 33; a sixth metal layer 35 placed on the third Ni layer 34; and a seventh metal layer 36 placed on the sixth metal layer 35.

In the semiconductor light emitting device according to the first embodiment of the present invention, the first metal layer 20 is formed by a Ti layer about 200 nm thick, for example, and the third metal layer 30 is also formed by a Ti layer about 200 nm thick, for example.

Since the adhesion of $SiO_2$ film used as the insulating film 26 and the Au layer used as the fourth metal layer 32 is wrong, it is because the adhesion is securable by intervening the Ti layer as the third metal layer 30.

The second metal layer 22 is formed by an Au layer having a thickness of about 200 nm, for example. The fourth metal layer 32 is formed by an Au layer having a thickness of about 1500 nm, for example.

Moreover, in the semiconductor light emitting device according to the first embodiment of the present invention, the fifth metal layer 33 is formed by an Al layer about 1600 nm thick, for example, the sixth metal layer 35 is formed by a Ti layer about 200 nm thick, for example, and the seventh metal layer 36 is formed by an Au layer about 1500 nm thick, for example. Moreover, the thickness of the third Ni layer 34 is about 200 nm, for example.

Moreover, an eighth metal layer 38 composed of an Au—Sn alloy layer may be placed on the seventh metal layer 36, for example. Or again Au—Sn alloy layer may be placed also on the fourth metal layer 32.

The transparent electrode layer 24 includes one of the ZnO, and the ZnO containing ITO, gallium, or aluminum. When applying ZnO as the transparent electrode layer 24, the thickness is about 400 nm.

Moreover, as shown in FIG. 1 to FIG. 2, the transparent electrode layer 24 is extended to and is placed on the p-type semiconductor layer 14.

Moreover, as shown in FIG. 1 to FIG. 2, the insulating film 26 covers and is placed on the side wall part of the transparent electrode layer 24 and the transparent electrode layer 24. For example, when using ZnO etc. as the transparent electrode layer 24, since it is easy to etch toward medicine, such as an acid and alkaline etching solution used in a subsequent process, a manufacturing yield can be improved by covering on the side wall part of the transparent electrode layer 24 and the transparent electrode layer 24 with the insulating film 26, as shown in FIG. 1 to FIG. 2.

Moreover, in the semiconductor light emitting device according to the first embodiment of the present invention, as shown in FIGS. 1 to 2, generating of the crack in the transparent electrode layer 24 occurred when the p-side electrode layer is directly placed on the transparent electrode layer 24 is avoidable by forming the opening of the second pattern width W2 in the transparent electrode layer 24, and forming the p-side electrode layer.

At this point, the thickness in the case of using $SiO_2$ film as the insulating film 26 is about 400 nm, for example.

Moreover, the first pattern width W1 is about 140 micrometers, for example, the second pattern width W2 is about 120 micrometers, for example, and the third pattern width W3 is about 100 micrometers, for example.

The width of the fourth metal layer 32 used by wire bonding etc. is about 130 micrometers, for example.

The sapphire substrate of c-plane (0001) and 0.25 degree off, etc. are adoptable as the substrate 10, for example. The n-type semiconductor layer 12, the active layer 13, and the p-type semiconductor layer 14 are composed of a III group nitride based semiconductor, respectively, and the buffer layer 16, the n-type semiconductor layer 12, the active layer 13, and the p-type semiconductor layer 14 are laminated one after another on the substrate 10.

(AlN Buffer Layer)

In the semiconductor light emitting device according to the first embodiment of the present invention, as shown in FIG. 1 to FIG. 2, the n-type semiconductor layer 12 may be formed via a buffer layer 16 on the substrate 10.

The buffer layer 16 is formed by an AlN layer about 1 nm to 5 nm thick, for example. When performing crystal growth of the AlN buffer layer 16, for example, it is made to grow up in the high temperature of a temperature span about 900 degrees C. to 950 degrees C.

It can form being able to grow up thin AlN buffer layer 16 about 1 to 5 nm thick at high speed, and the crystal quality also keeping satisfactory by supplying trimethyl aluminum (TMA) and ammonia ($NH_3$) to a reaction chamber by applying H2 gas as a carrier.

According to the semiconductor light emitting device according to the first embodiment of the present invention, the crystal quality and surface morphology of the III group nitride based semiconductor which are formed on high temperature AlN buffer layer are improvable.

(N-Type Semiconductor Layer)

The n-type semiconductor layer 12 supplies an electron to the active layer 13, and the p-type semiconductor layer 14 supplies a hole to the active layer 13. When the electron and the hole which are supplied recombine by the active layer 13, the light is generated.

The III group nitride based semiconductor of about 1 to 6 micrometers of the film thickness which performed impurities doping of the n-type impurities, such as silicon (Si), for example, a AlGaN layer etc., can use as the n-type semiconductor layer 12.

(Active Layer)

The active layer 13 has the layered structure by which the barrier layer and the well layer in which a band gap is smaller than the barrier layer is placed by turns. The barrier layer included in the active layer 13 is hereinafter named generically, and is called a "barrier layer". Moreover, all the well layers included in the active layer 13 are named generically, and are called "well layer".

The active layer 13 is inserted in the shape of sandwiches by the barrier layer composed of an $Al_xGa_{1-x}N$ layer with a greater band gap ($0<x<1$) than the well layer with the well layer composed of an $Al_xIn_yGa_{1-x-y}N$ layer ($0<x<=y<1$, $0<x+y<1$), and it has n-pair structure which laminates this unit pair structure n times.

Moreover, impurities doping of the n-type impurity may be applied by all at the barrier layer composed of an $Al_xGa_{1-x}N$ layer ($0<x<1$) and the well layer composed of an $Al_xIn_yGa_{1-x-y}N$ layer ($0<x<=y<1$, $0<x+y<1$). For example, the impurities doping of the Si atom may be performed about $5\times10^{16}$ as an n-type impurity, for example.

Moreover, the number of pairs of the multiplex quantum well layer is characterized by being 2 to 8, for example. In addition, the ratio {y/(1−x−y)} of indium (In) of the well layers is suitably set up according to the wavelength of light to be generated.

For example, the composition ratio y of In is about 0.15, and the composition ratio of Al is about 0.01 to about 0.1, for example.

The thickness of the well layer is about 2 to 3 nm (preferable about 2.8 nm), for example, and the thickness of the barrier layer is about 7 to 18 nm (preferable about 16.5 nm).

In the semiconductor light emitting device according to the first embodiment of the present invention, the number of MQW pairs in the active layer 13 for the electron supplied from the n-type semiconductor layer 12 and the hole supplied from the p-type semiconductor layer 14 to recombine efficiently in the active layer 13 can be optimized.

In the semiconductor light emitting device according to a first embodiment of a present invention, since it has the well layer composed of the $Al_xIn_yGa_{1-x-y}N$ (where $0<x<=y<1$, $0<x+y<1$) layer, and the barrier layer composed of the $Al_xGa_{1-x}N$ layer (where $0<x<1$) with a greater band gap than the $Al_xIn_yGa_{1-x-y}N$ (where $0<x<=y<1$, $0<x+y<1$) layer as the active layer 13, the transparency over the luminous wavelength can be improved and the tolerance over the heat damage toward a subsequent high temperature process can be improved.

(P-Type Semiconductor Layer)

The III group nitride based semiconductor of about 0.05 to 1 micrometer of the film thickness which performed impurities doping of the p-type impurity, for example, a p-type $Al_xGa_{1-x}N$ layer ($0<x<1$) etc., can be used as the p-type semiconductor layer 14. As the p-type impurity, it is usable in magnesium (Mg), zinc (Zn), cadmium (Cd), calcium (Ca), beryllium (Be), carbon (C), etc.

The configuration example of the p-type semiconductor layer 14 is as follows in detail. That is, the p-type semiconductor layer 14 includes: an electron barrier layer which is placed on the upper part of the active layer 13, and is composed of an $Al_xGa_{1-x}N$ layer ($0<x<1$) by which impurities doping of the p-type impurity is performed; an electron cap layer which is composed of an $Al_xGa_{1-x}N$ layer ($0<x<1$) by which it has been placed on an electron barrier layer and impurities doping of the p-type impurity is performed; a first nitride based semiconductor layer which is placed on the electron cap layer and is composed of an $Al_xGa_{1-x}N$ layer ($0<x<1$) by which impurities doping of the p-type impurity is performed; a second nitride based semiconductor layer which is placed on the first nitride based semiconductor layer, and is composed of an $Al_xGa_{1-x}N$ layer ($0<x<1$) by which impurities doping of the low-concentration p-type impurity is performed rather than the p-type impurity of the first nitride based semiconductor layer; a third nitride based semiconductor layer which is placed on the second nitride based semiconductor layer, and is composed of an $Al_xGa_{1-x}N$ layer ($0<x<1$) by which impurities doping of the high-concentration p-type impurity is performed rather than the p-type impurity of the second nitride based semiconductor layer; and a fourth nitride based semiconductor layer which is placed on the third nitride based semiconductor layer, and is composed of an $Al_xGa_{1-x}N$ layer ($0<x<1$) by which impurities doping of the low-concentration p-type impurity is performed rather than the p-type impurity of the third nitride based semiconductor layer. The thickness of the second nitride based semiconductor layer is formed more thickly than the thickness of the first nitride based semiconductor layer or the thickness of the third nitride based semiconductor layer to the fourth nitride based semiconductor layer.

At this point, the material and the thickness of each layer are specifically explained. The first nitride based semiconductor layer which is placed in the upper part of the active layer 13, and includes the p-type impurity is formed, for example by a p-type $Al_xGa_{1-x}N$ layer (where $0<x<1$) about 40 nm thick in Mg by about $1.3\times10^{20}$ $cm^{-3}$ by which impurities doping is performed.

The second nitride based semiconductor layer which is placed on the first nitride based semiconductor layer, and includes the low-concentration p-type impurity rather than the p-type impurity of the first nitride based semiconductor layer is formed, for example by a p-type $Al_xGa_{1-x}N$ layer (where $0<x<1$) about 90 nm thick in Mg by about $2.7\times10^{19}$ $cm^3$ by which impurities doping is performed.

The third nitride based semiconductor layer which is placed on the second nitride based semiconductor layer, and includes the high-concentration p-type impurity rather than the p-type impurity of the second nitride based semiconductor layer is formed, for example by a p-type $Al_xGa_{1-x}N$ layer (where $0<x<1$) about 20 nm thick in Mg by about $1.2\times10^{20}$ $cm^{-3}$ by which impurities doping is performed.

The fourth nitride based semiconductor layer which is placed on the third nitride based semiconductor layer, and includes a low-concentration p-type impurity rather than the p-type impurity of the third nitride based semiconductor layer is formed, for example, by a p-type $Al_xGa_{1-x}N$ layer (where $0<x<1$) about 5 nm thick in Mg by about $5\times10^{19}$ $cm^{-3}$ by which impurities doping is performed. The fourth nitride based semiconductor layer functions as a p-type contact layer.

In the semiconductor light emitting device according to the first embodiment, the p-type semiconductor layer 14 formed on the active layer 13 is composed of the p-type $Al_xGa_{1-x}N$ layers (where $0<x<1$) of a structure from which Mg concentration differs, as mentioned above, and is doped by the above-mentioned concentration. The p-type $Al_xGa_{1-x}N$ layer (where $0<x<1$) grows at low temperature about 800 degrees C. to 900 degrees C. in order to reduce the heat damage to the active layer 13.

Since light emitting power becomes high so that Mg concentration is high, the first nitride based semiconductor layer nearest to the active layer 13 is so preferable that Mg concentration is high.

As for the second nitride based semiconductor layer, since the crystal defect resulting from Mg increases and membranous resistance becomes high if it performs impurities doping of Mg too much, it is preferable that the Mg concentration is about the middle of the level of $10^{19}$ $cm^{-3}$.

Since the third nitride based semiconductor layer is a layer which determines the amount of hole injections to the active layer 13, its Mg concentration slightly higher than the second nitride system semiconductor layer is preferable.

The fourth nitride based semiconductor layer is a p-type AlGaN layer for reserving ohmic contact with the transparent electrode layer 24, and is made depletion substantially. As the transparent electrode layer 24, when the ZnO electrode by which impurities doping of Ga or Al is performed about $1\times10^{19}$ to $5\times10^{21}$ $cm^{-3}$ is used, the impurities doping of Mg is performed at the fourth nitride based semiconductor layer, for example so that it may become the Mg concentration at the time when most reducing the forward voltage $V_f$ of the semiconductor light emitting device.

When growing up the p-type $Al_xGa_{1-x}N$ layers (where $0<x<1$), since the third nitride based semiconductor layer near the p-side electrodes (20, 22, 30, 32), and the fourth nitride based semiconductor layer need to raise the hole concentration in the film, they increase $H_2$ gas volume in the carrier gas. Moreover, the first nitride based semiconductor layer and the second nitride based semiconductor layer near the active layer 13 do not have to increase the $H_2$ gas volume in the carrier gas, and are made to perform crystal growth by the extension into which the active layer 13 is grown up by the $N_2$ carrier gas. When growing up these p-type $Al_xGa_{1-x}N$ layers (where $0<x<1$), the way which made the V/III ratio as high as possible can grow up the film which is lower resistance, and can drop the forward voltage ($V_f$) of the light emitting device.

According to the semiconductor light emitting device according to the first embodiment of the present invention, by forming the p-type semiconductor layer at low temperature, reducing the heat damage to the active layer and forming the p-type semiconductor layer rather than the GaN layer by the large $Al_xGa_{1-x}N$ layer ($0<x<1$) of the band gap, the transparency over the luminous wavelength is improved, and the forward voltage ($V_f$) can be reduced and the luminous efficiency can be improved.

(Reflective Stacked Film)

The reflective stacked film 28 has the layered structure of $\lambda/4n_1$ and $\lambda/4n_2$ (where $n_1$ and $n_2$ are refractive indices of a layer to laminate). As a material used for layered structure, the layered structure composed of $ZrO_2$ (n=2.12) and $SiO_2$ (n=1.46) can be used, for example toward λ=450 nm blue light. The thickness of each layer in this case sets $ZrO_2$ to about 57 nm, and sets $SiO_2$ to about 75 nm, for example. $TiO_2$, $Al_2O_3$, etc. can also be used as other materials for forming the layered structure.

According to the semiconductor light emitting device according to the first embodiment of the present invention, since the light which emitted light within the active layer 13 by the reflective stacked film 28 can be extracted from the substrate 10 side external, without being absorbed by the n-side electrodes (33, 34, 35, 36, 38), outward luminous efficiency can be improved.

The flip chip structure become the path which extracts the light from the AlGaN layer side to the external through the sapphire substrate 10 is effective at the point which may improve in particular outward luminous efficiency. By creating the substrate in which the protective film 18 in which refractive indices differ partially is formed to up to the different species substrate 10, growing the AlGaN layer epitaxially to the above-mentioned substrate 10 on this, and forming the light emitting device, unevenness can be formed on the interface between the epitaxial growth layer and the substrate, dispersion and diffraction of light occur, and optical extraction efficiency can be improved.

According to the semiconductor light emitting device according to the first embodiment of the present invention, since dope the Al to the n-type semiconductor layer 12, the active layer 13, and the p-type semiconductor layer 14, a heat damage is decreased and the transparency over a luminous wavelength can be improved, and the light which emitted light within the active layer 13 by the reflective stacked film 28 can be extracted external, without being absorbed by the n-side electrodes (33, 34, 35, 36, 38), the outward luminous efficiency can be improved.

(Wire Bonding Structure)

In the structure shown in FIG. 1 to FIG. 2, when not forming the eighth metal layer 38, it becomes the structure which a level difference occurs on the surface of the fourth metal layer 32 and the surface of the seventh metal layer 36. In this case, electrode attachment and mounting of the n-side electrode and the p-side electrode can be achieved by wire bonding. Or again, as shown in FIG. 1 to FIG. 2, for example, when the eighth metal layer 38 composed of an Au—Sn alloy layer is formed, it is clear that the electrode attachment and the mounting of the n-side electrode and the p-side electrode can be achieved by the wire bonding.

Figure 3:
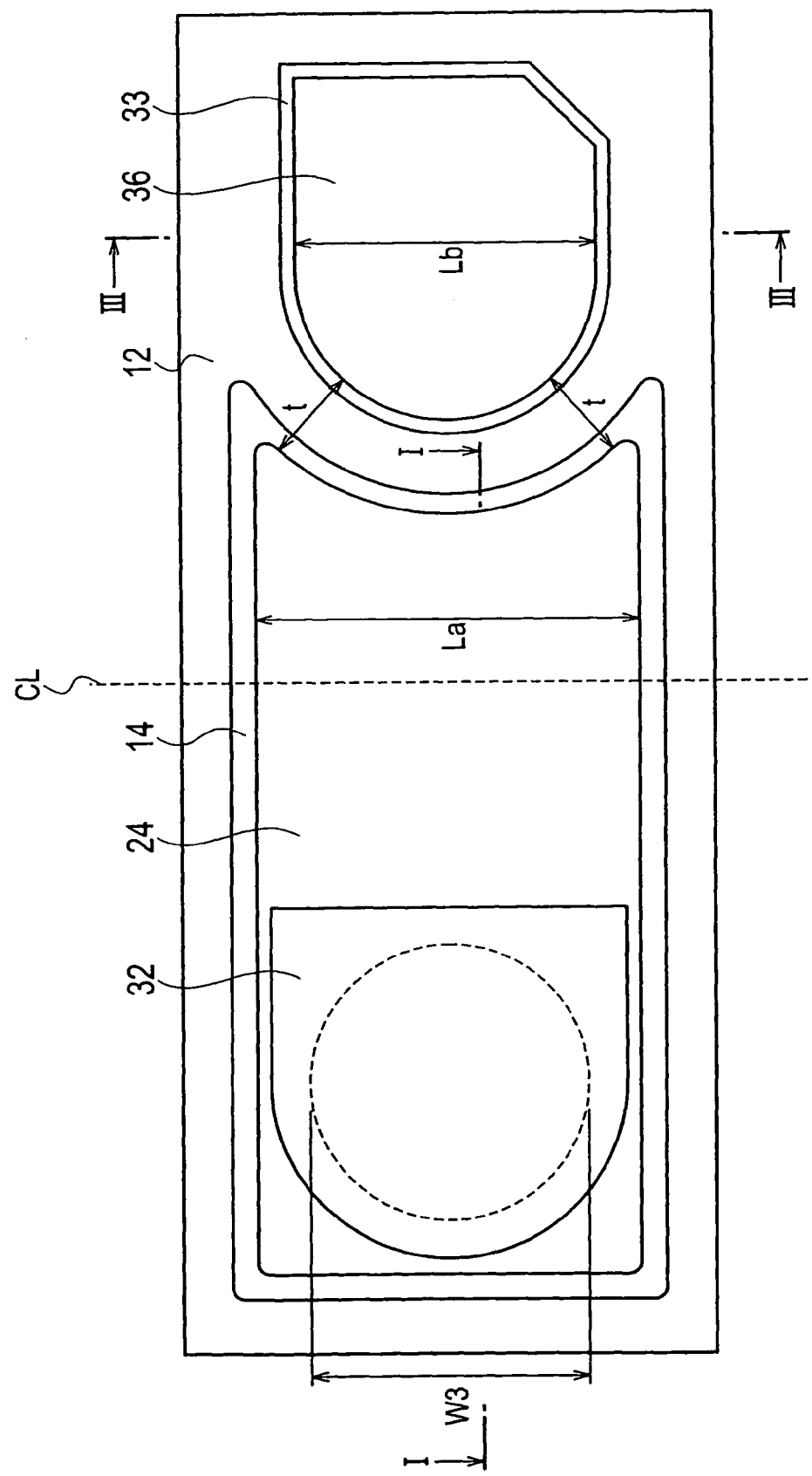
FIG. 3 is a schematic plane pattern configuration diagram by a wire bonding configuration of the semiconductor light emitting device according to the first to third embodiments of the present invention.

As shown in FIG. 3, on the n-type semiconductor layer 12, the fifth metal layer 33 is placed and the seventh metal layer 36 is placed via the third Ni layer 34 and the sixth metal layer 35 (neither is shown in FIG. 3).

Moreover, as shown in FIG. 3, the transparent electrode layer 24 is extended to and is placed on the p-type semiconductor layer 14, and the fourth metal layer 32 is placed on the opening patterned by third pattern width W3 via the insulating film 26 and the reflective stacked film 28 (neither is shown in FIG. 3). In FIG. 3, the first metal layer 20, the second metal layer 22, and the third metal layer 30 are omitting illustration.

The structure for alleviating the electric field concentrates between the seventh metal layer 36 and the fourth metal layer 32 is used for the shape of the fourth metal layer 32 shown in FIG. 3.

In the plane pattern configuration shown in FIG. 3, the rectangular form in which a long side has the length of about 2.0 to 2.8 times rather than a shorter side is shown. As shown in FIG. 3, center line CL which bisects a long side to a shorter side in parallel is inserted, and the first pad (p-side) electrode which is composed of the fourth metal layer 32 mutually formed in the opposite side, and the second pad (n-side) electrode which is composed of the seventh metal layer 36 are placed.

Moreover, in the plane pattern configuration shown in FIG. 3, it has a substantially circular curve profile between the second pad (n-side) electrode which is composed of the seventh metal layer 36, and the transparent electrode layer 24 (or mesa etching level difference part), and the interval has substantially constant distance in the distance t. The width La and Lb of the short side direction and the parallel direction of each electrode has the relationship of La>Lb, and it is placed so that a current spread may become uniform more.

Figure 4:
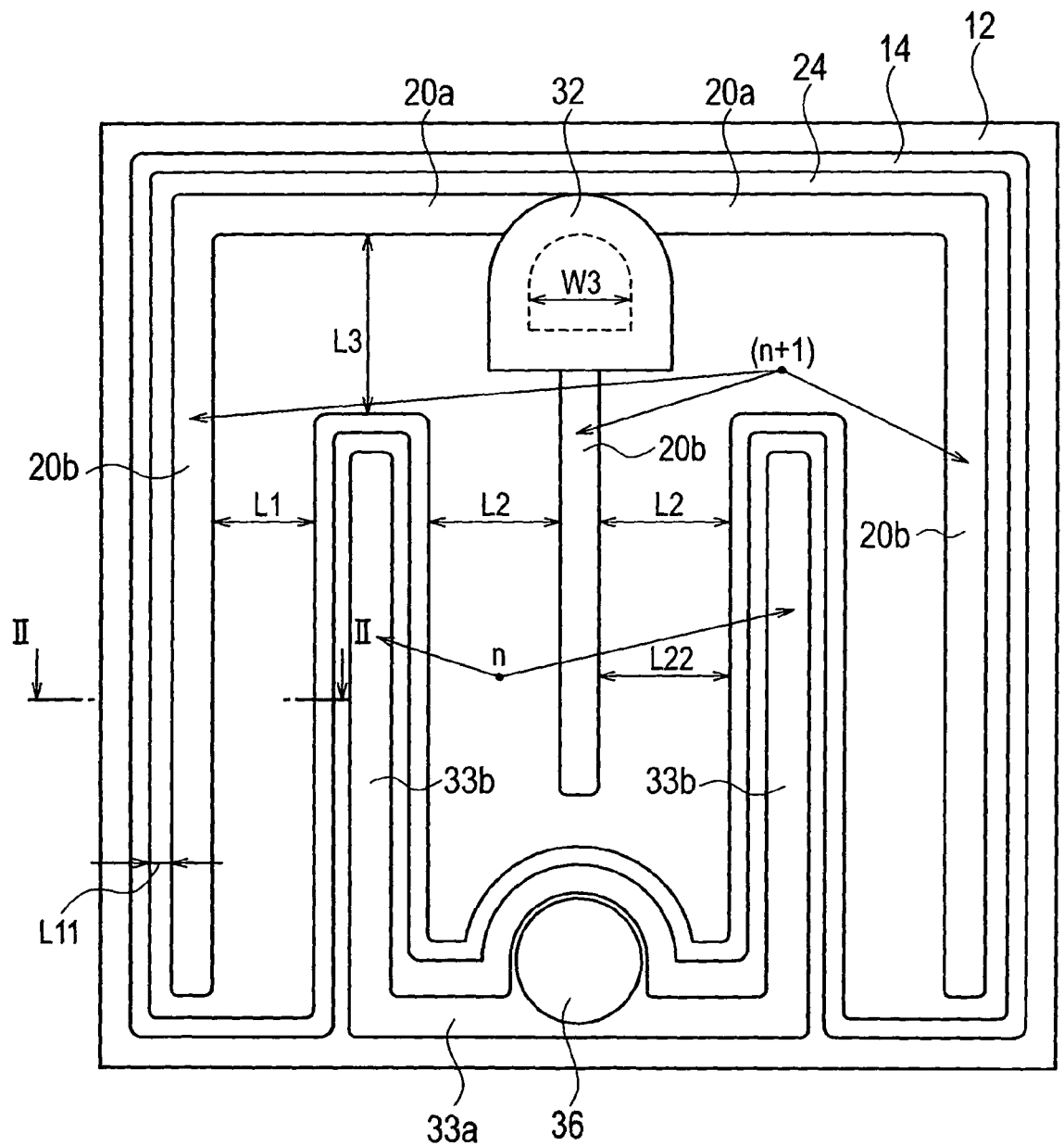
FIG. 4 is another schematic plane pattern configuration diagram by the wire bonding configuration of the semiconductor light emitting device according to the first to the third embodiments of the present invention.

As shown in FIG. 4, on the n-type semiconductor layer 12, the fifth metal layer 33 is placed, and the seventh metal layer 36 is placed as well as FIG. 3 via the third Ni layer 34 and sixth metal layer 35 (neither is shown in FIG. 3).

Moreover, as shown in FIG. 4, on the p-type semiconductor layer 14, the transparent electrode layer 24 is extended and is placed, and the fourth metal layer 32 is placed on the opening patterned by the third pattern width W3 via the insulating film 26 and the reflective stacked film 28 (neither is shown in FIG. 3).

Moreover, as shown in FIG. 4, the first metal layer 20 is also extended to and is placed on the p-type semiconductor layer 14. In FIG. 4, the second metal layer 22 and the third metal layer 30 are omitting illustration.

The schematic section structure taken in the line II-II of FIG. 4 is shown in FIG. 2. In FIG. 4, it places so that the distance between the stripe of the first metal layer 20 and the stripe of the fifth metal layer 33 may become narrow, as being isolated from the firth metal layer 32, when the distance between the stripe of the first metal layer 20 and the stripe of the fifth metal layer 33 is compared. For example, in FIG. 4, it is the distance L1<L2<L3. In the position isolated from the fourth metal layer 32 acting as the p-side electrode layer, the distance between the stripe of the first metal layer 20 that opposes, and the stripe of the fifth metal layer 33 is set up become short. By using such an arrangement pattern, on the semiconductor light emitting device surface, the electric field concentrates between the stripe of the first metal layer 20 and the stripe of the fifth metal layer 33 can be alleviated and also can equalize over the wide range.

In the plane pattern configuration shown in FIG. 4, the fifth metal layer 33 extended from the second pad (n-side) electrode which is composed of the seventh metal layer 36 includes a metallic wiring 33*a* extended to and placed on from the end of one side to the central part of one side among the four sides by which the second pad electrode is placed; and n metallic wirings (where n is even number) 33*b* at which it turned 90 degrees substantially in the direction of the first pad (p-side) electrode from there.

In the plane pattern configuration shown in FIG. 4, the first metal layer 20 extended from the first pad (p-side) electrode which is composed of the fourth metal layer 32 includes: a metallic wiring 20*a* which is extended to and is placed on the end of all the one side from the central part of one side where the first pad electrode is placed, among the four sides which oppose the second pad electrode; and (n+1) metallic wirings 20*b* (where n is even number) at which it turned 90 degrees substantially in the direction of the second pad electrode from there.

In the plane pattern configuration shown in FIG. 4, the n metallic wirings 33*b* and the (n+1) metallic wirings 20*b* (where n is even number) have the structure placed by turns in the shape of the teeth of a comb, and the distance L1, L2, and L3 between the metallic wiring of each stripe geometry have the relationship of L1<L2<L3. That is, it has the relationship of L1<L2<L3, where the distance between the fourth metallic wiring 20b and the transparent electrode layers 24 near the second metallic wiring 33b is L1, the distance between the transparent electrode layer 24 near the second metallic wiring 33b and the fourth metallic wiring 20b of the central part is L2, and the distance between the transparent electrode layer 24 near the second metallic wiring 33b and the third metallic wiring 20a is L3.

In the plane pattern configuration shown in FIG. 4, as for the first metal layer 20 extended from the first pad electrode, in the two metallic wirings 20b nearest to four sides of the periphery, the distance L11 between the transparent electrode layer 24 and the metallic wiring 20b has the relationship of L11<L1, and the distance L22 between the transparent electrode layer 24 and the metallic wiring 20b has the relationship of L22=L2 except the peripheral part.

Figure 5:
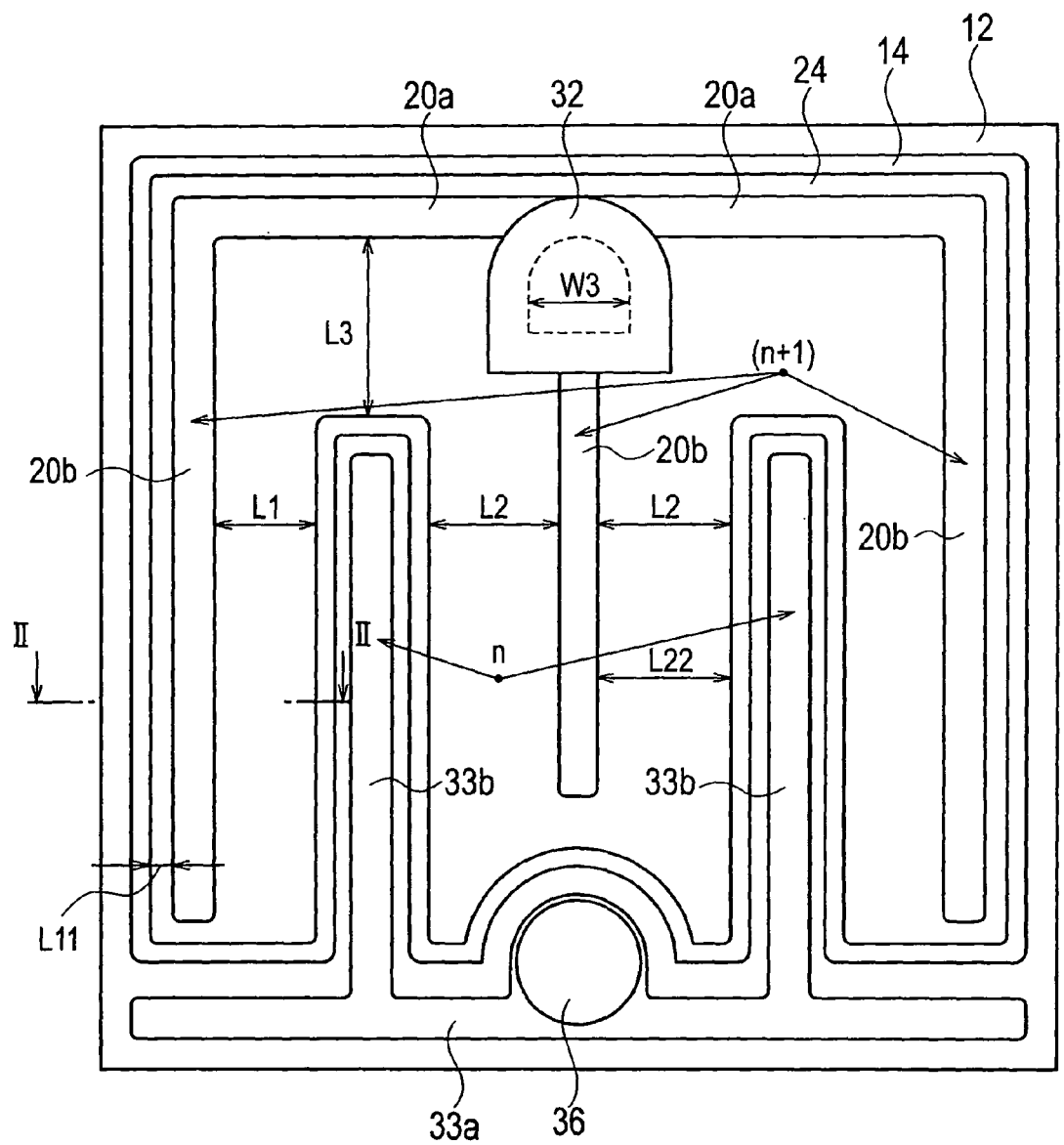
FIG. 5 is another schematic plane pattern configuration diagram by the wire bonding configuration of the semiconductor light emitting device according to the first to the third embodiments of the present invention.

Moreover, in the plane pattern configuration shown in FIG. 5, the fifth metal layer 33 extended from the second pad (n-side) electrode which is composed of the seventh metal layer 36 includes: a metallic wiring 33a which is extended to and is placed on from the end of one side to all the one side approximately, among the four sides by which the second pad electrode is placed; and metallic wirings 33b of n pieces (where n is even number) turned 90 degrees substantially in the direction of the first pad (p-side) electrode from there.

Moreover, in the plane pattern configuration shown in FIG. 5, the first metal layer 20 extended from the first pad (p-side) electrode which is composed of the fourth metal layer 32 includes: a metallic wiring 20a which is extended to and is placed on all the sides of the end of one side from the central part of one side where the first pad electrode is placed, among the four sides which oppose the second pad electrode; and metallic wirings 20b of (n+1) pieces (where n is even number) turned 90 degrees substantially in the direction of the second pad electrode from there.

In the plane pattern configuration shown in FIG. 5, the metallic wirings 33b of n pieces and the metallic wirings 20b of (n+1) pieces (where n is even number) have the structure placed by turns in the shape of the teeth of a comb, and the distance L1, L2, and L3 between the metallic wiring of each stripe geometry have the relationship of L1<L2<L3. That is, it has the relationship of L1<L2<L3, where the distance between the fourth metallic wiring 20b and the transparent electrode layers 24 near the second metallic wiring 33b is L1, the distance between the transparent electrode layer 24 near the second metallic wiring 33b and the fourth metallic wiring 20b of the central part is L2, and the distance between the transparent electrode layer 24 near the second metallic wiring 33b and the third metallic wiring 20a is L3.

In the plane pattern configuration shown in FIG. 5, as for the first metal layer 20 extended from the first pad electrode, in the two metallic wirings 20b nearest to four sides of the periphery, the distance L11 between the transparent electrode layer 24 and the metallic wiring 20b has the relationship of L11<L1, and the distance L22 between the transparent electrode layer 24 and the metallic wiring 20b has the relationship of L22=L2 except the peripheral part.

Moreover, FIG. 6 shows an example of a schematic plane pattern configuration by the wire bonding configuration of the semiconductor light emitting device according to the first embodiment of the present invention. FIG. 6A shows a schematic plane pattern configuration example of WA=1 mm square, FIG. 6B shows a schematic plane pattern configuration example of WB=0.6 mm square, FIG. 6C shows another schematic plane pattern configuration example of WC=1 mm square, and FIG. 6D shows a schematic plane pattern configuration example of WD=0.4 mm square, respectively. The pattern configuration example of FIG. 6A corresponds to the configuration example of FIG. 4.

Since it is necessary to secure the bonding pad region in the case of the wire bonding structure, although reduction of the size of the fourth metal layer 32 and the seventh metal layer 36 cannot be applied by equivalent scale-down compared with the reduction of a chip of the semiconductor light emitting device, the mounting is possible for the semiconductor light emitting device by which reduction is applied to about 1 mm to about 0.4 mm, for example.

(Flip Chip Structure)

Figure 11:
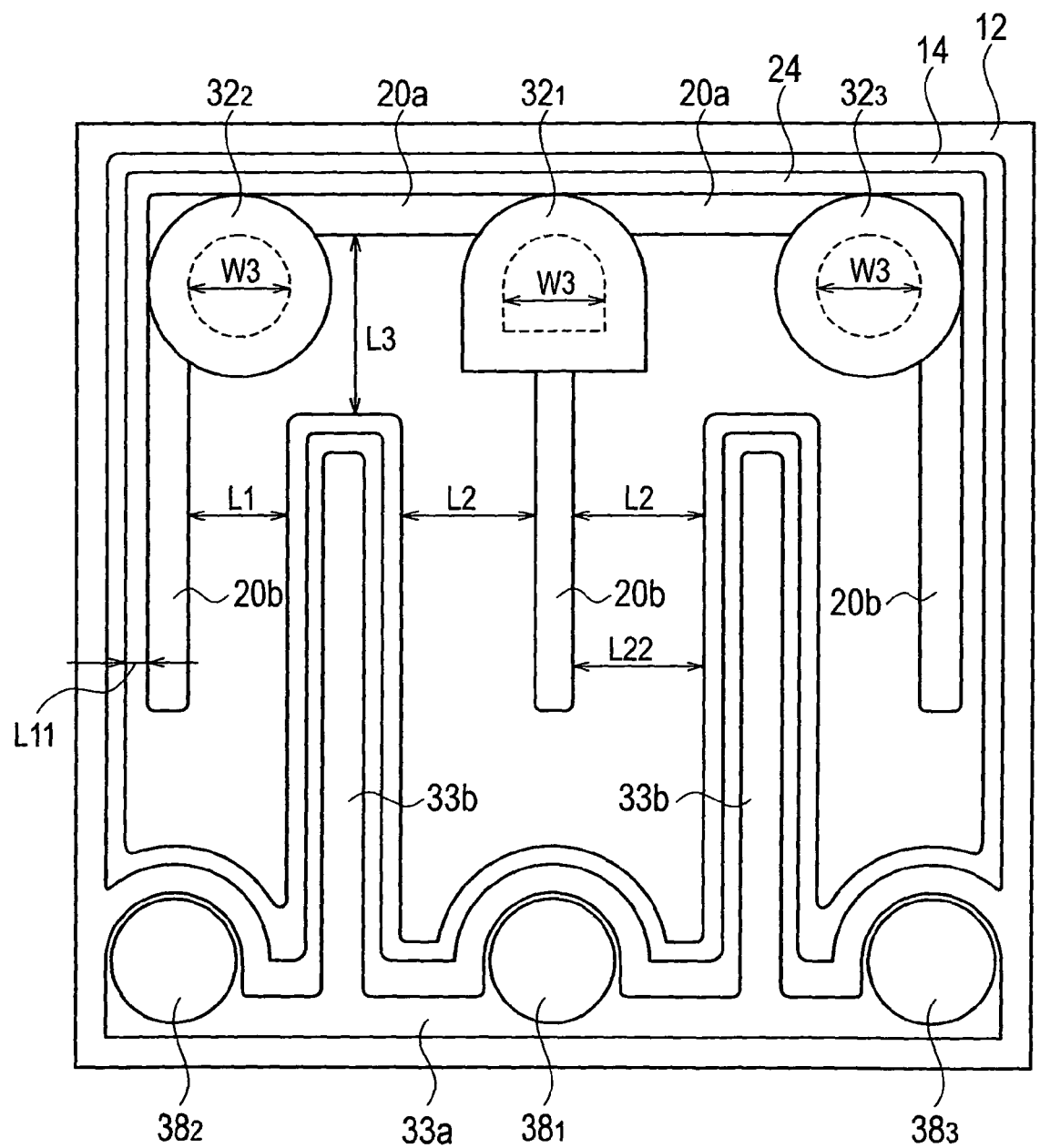
FIG. 11 is a schematic plane pattern configuration diagram by a flip chip configuration of the semiconductor light emitting device according to the first embodiment of the present invention.
Figure 12:
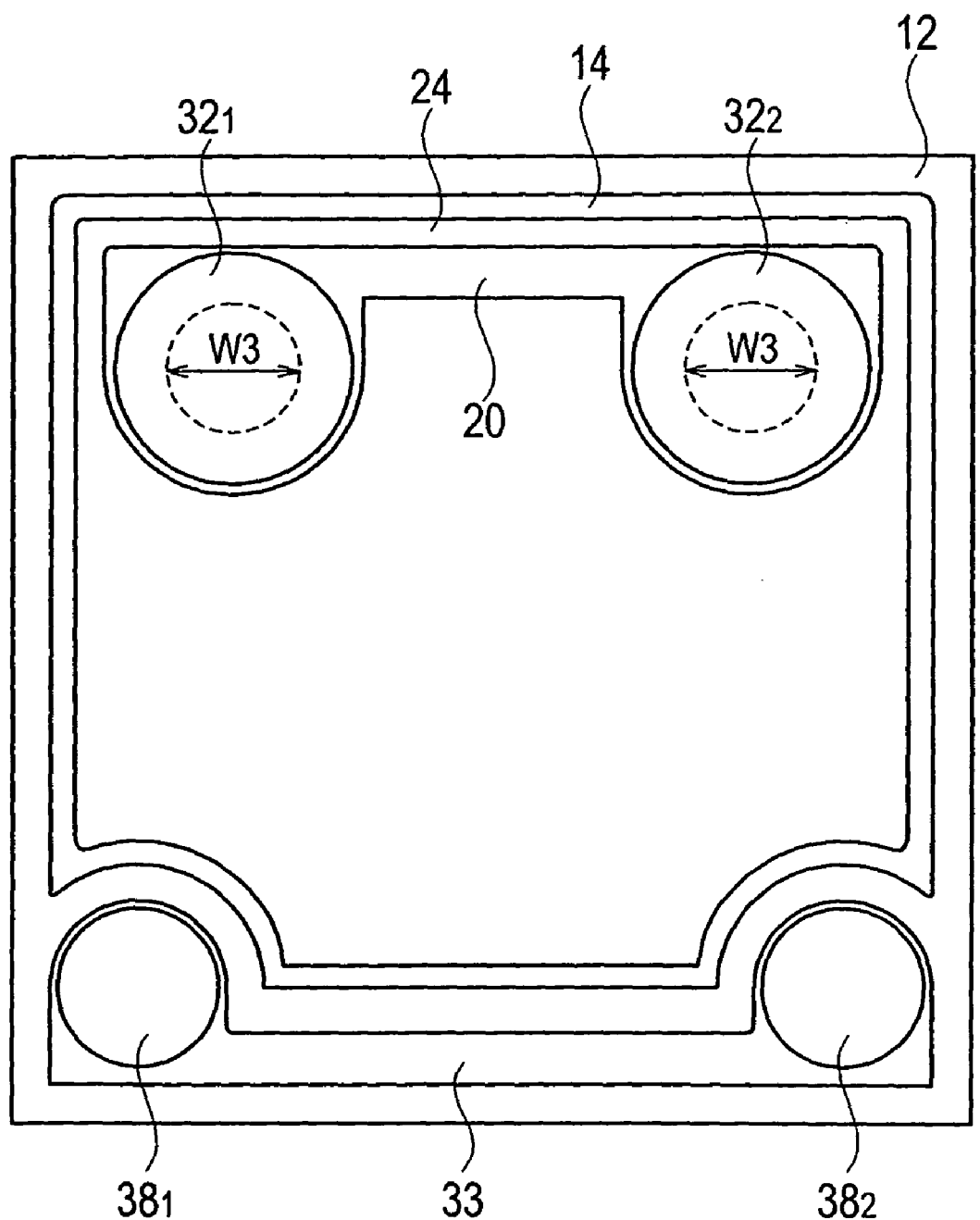
FIG. 12 is a schematic plane pattern configuration diagram by another flip chip configuration of the semiconductor light emitting device according to the first embodiment of the present invention.

FIG. 11 shows a schematic plane pattern configuration diagram according to a flip chip configuration of the semiconductor light emitting device according to the first embodiment of the present invention. Moreover, FIG. 12 shows a schematic plane pattern configuration diagram according to another flip chip configuration of the semiconductor light emitting device according to the first embodiment of the present invention. The chip size of the semiconductor light emitting device of FIG. 11 is an example of about 1 mm square. On the other hand, the chip size of FIG. 12 is an example of about 0.6 mm squares.

As shown in FIG. 11, on the n-type semiconductor layer 12, the fifth metal layer 33 is placed, and the eighth metal layers $38_1$, $38_2$, and $38_3$ are placed via the Ni layer 34 and the sixth metal layer 35 (neither is shown in FIG. 11). In the flip chip structure, as shown in FIG. 1, for example, the height of the surface of the fourth metal layer 32 achieved from the substrate 10 and the height of the surface of the eighth metal layer 38 are placed equally substantially.

Moreover, as shown in FIG. 11, on the p-type semiconductor layer 14, the transparent electrode layer 24 is extended and is placed, and the fourth metal layers $32_1$, $32_2$, and $32_3$ are placed on the opening patterned by third pattern width W3 via the insulating film 26 and the reflective stacked film 28 (neither is shown in FIG. 11).

Moreover, as shown in FIG. 11, the first metal layer 20 also extended to and is placed on the p-type semiconductor layer 14. In FIG. 11, the second metal layer 22 and third metal layer 30 are omitting illustration.

In the semiconductor light emitting device according to the first embodiment of the present invention, as shown in FIG. 11, the mounting by electrode attachment becomes easy by providing the flip chip structure. Moreover, it can equalize substantially and conduction of the current can be applied over the whole chip of the semiconductor light emitting device, by being divided the fourth metal layers $32_1$, $32_2$, and $32_3$ and the eighth metal layers $38_1$, $38_2$, and $38_3$ into plurality.

Moreover, when using for the wire bonding the plane pattern configuration shown in FIG. 11 to FIG. 12, since it has a bonding pad in a plurality of parts, the stability at the time of connection improves. Moreover, since the bonding pad is plurality, the reliability toward a wire misalignment etc. improves. Furthermore, since the bonding pad is plurality and the current distributes, the reliability toward a wire disconnection etc. also improves. Moreover, the light reflected by the reflective stacked film 28 is efficiently extracted from the substrate 10 side by the flip chip structure.

Moreover, as shown in FIG. 3 to FIG. 6 or FIG. 11 to FIG. 12, the distinction for pad recognition becomes easy and a pad recognition rate improves by forming the pad shape for the n-side electrode layer and the pad shape for the p-side electrode layer in different shape.

Furthermore, also in the plane pattern configuration of FIG. 11, the metal wiring pattern is placed as well as FIG. 4 to FIG. 5, and, the number of pad electrodes mutually is a rate of one piece every about 300 to 500 micrometers, for example and the pad electrodes may be placed, among the four sides which oppose in parallel to the end of two sides.

(Fabrication Method)

As shown in FIG. 1 to FIG. 2, a fabrication method of the semiconductor light emitting device according to the first embodiment of the present invention includes the step of forming the n-type semiconductor layer 12 doped with the n-type impurity on the substrate 10; the step for forming the active layer 13 on the n-type semiconductor layer 12; the step of forming the p-type semiconductor layer 14 doped with the p-type impurity on the active layer 13; the step of forming the first metal layer 20 on the p-type semiconductor layer 14; the step of forming the second metal layer 22 on the first metal layer 20; the step of patterning the first metal layer 20 and second metal layer 22 with the first pattern width W1; the step of forming the opening patterned with the second pattern width W2 on the second metal layer 22 after forming the transparent electrode layer 24 on the second metal layer 22 and the p-type semiconductor layer 14; the step of forming the insulating film 26 on the transparent electrode layer 24 and the second metal layer 22; the step of forming the reflective stacked film 28 on the insulating film 26; the step of forming the opening which has the third pattern width W3 on the second metal layer 22 after patterning the insulating film 26 and the reflective stacked film 28; the step of forming the third metal layer 30 on the second metal layer 22 of the opening which has the reflective stacked film 28 and the third pattern width W3; and the step of forming the fourth metal layer 32 on the third metal layer 30.

Moreover, as shown in FIG. 1 to FIG. 2, the fabrication method of the semiconductor light emitting device according to the first embodiment of the present invention includes the step of forming the fifth metal layer 33 on the n-type semiconductor layer 12 which removed a part of the p-type semiconductor layer 14, the active layer 13, and the n-type semiconductor layer 12 by etching; the step of forming the third Ni layer 34 on the fifth metal layer 33; the step of forming the sixth metal layer 35 on the third Ni layer 34; and the step of forming the seventh metal layer 36 on the sixth metal layer 35.

Moreover, the fifth metal layer 33 is formed by the Al layer, the sixth metal layer 35 is formed by the Ti layer, and the seventh metal layer 36 is formed by the Au layer.

Moreover, the first metal layer 20 and the third metal layer 30 are formed by the Ti layer, and the second metal layer 22 and fourth metal layer 32 are formed by the Au layer.

In the following, an example of the fabrication method of the semiconductor light emitting device according to the first embodiment of the present invention shown in FIG. 1 will be explained. In addition, the fabrication method of the semiconductor light emitting device described in the following is an example, and, of course, it can achieve with various fabrication methods except this method, including this modified example. Here, an example which applies the sapphire substrate to the substrate 10 will be explained.

(a) First of all, grow up the AlN buffer layer 16 on the sapphire substrate 10 exposed by the MOCVD (Metal Organic Chemical Vapor Deposition) method etc. which are well known. For example, by supplying trimethyl aluminum (TMA) and ammonia ($NH_3$) to a reaction chamber by applying $H_2$ gas as a carrier in high temperature (about 900 degrees C. to about 950 degrees C.), the thin AlN buffer layer 16 about 10 to 50 angstrom thick is grown up for a short time.

(b) Next, grow up the $Al_xGa_{1-x}N$ layer (0<x<1) acting as an epitaxial lateral overgrowth layer by the MOCVD method etc. on the AlN buffer layer 16. For example, after performing thermal cleaning of the substrate 10 in which the AlN buffer layer 16 is formed, set the substrate temperature as the about 1000 degrees C., and grown up the epitaxial lateral overgrowth layer about 1 to 5 micrometers which performed impurities doping of the n-type impurity on the AlN buffer layer 16. In the epitaxial lateral overgrowth layer, the impurities are doped for Si by about $3 \times 10^{18}$ cm$^{-3}$ concentration, for example as the n-type impurity. When performing impurities doping of the Si, trimethylgallium (TMG), ammonia ($NH_3$), and a silane ($SiH_4$) are supplied as material gas, and the epitaxial lateral overgrowth layer is formed. Penetration dislocation is occurred in the $Al_xGa_{1-x}N$ layer (0<x<1) acting as the epitaxial lateral overgrowth layer.

(c) Next, form a recovery layer by ELO (Epitaxially Lateral Over growth). The epitaxially lateral over growth layer is formed on m-plane or a-plane, which is the epitaxially lateral over growth plane, and selective epitaxial growth of the recovery layer is performed to a horizontal direction. As a result, the penetration dislocation is also bent, the selective epitaxial growth plane from right and left unites near central part of the protective film, and the penetration dislocation is also linked simultaneously.

Furthermore, the pressure and the growth temperature conditions which form a recovery layer are changed, dividing into the step of several times is also possible, for example, the n-type semiconductor layer 12 of layered structure can also be formed. By doing in this way, the surface morphology of the n-type semiconductor layer 12 is improved, and the crystal quality can be improved.

(d) Next, form the active layer 13 on the n-type semiconductor layer 12. For example, the barrier layer composed of the $Al_xGa_{1-x}N$ layer (where 0<x<1), and the well layer composed of the $Al_xIn_yGa_{1-x-y}N$ layer (where 0<x<=y<1, 0<x+y<1) are laminated by turns, and then the active layer 13 is formed. More specifically, adjusting the substrate temperature and the flow rate of material gas at the time of forming the active layer 13, the barrier layer and the well layer are grown up continuously by turns, and the active layer 13 which the barrier layer and the well layer laminate is formed. That is, by adjusting the substrate temperature and the flow rate of material gas, the step of laminating the well layer and the barrier layer with a larger band gap than the well layer is applied into a unit step, this unit step is repeated n times (for example, about 8 times), and the layered structure by which the barrier layer and the well layer are laminated by turns is obtained.

When forming the barrier layer, TMG gas, TMA gas, and $NH_3$ gas are supplied to a processing unit for film formation as material gas, respectively, for example. On the other hand, when forming the well layer, TMG gas, TMA gas, trimethylindium (TMI) gas, and $NH_3$ gas are supplied to the processing unit as material gas, respectively, for example. In addition, TMG gas is supplied as the material gas of a Ga atom, TMI gas is supplied as the material gas of In atom, TMA gas is supplied as the material gas of Al atom, and $NH_3$ gas is supplied as the material gas of a nitrogen atom.

(e) Next, set the substrate temperature to about 800 degrees C. to 900 degrees C., and form about 0.05 to 1 micrometer of p-type semiconductor layers 14 which performed impurities doping of the p-type impurity on the active layer 13. When performing impurities doping of Mg as the p-type impurity, TMG gas, TMA gas, $NH_3$ gas, and bis(cyclopentadienyl) magnesium ($Cp_2Mg$) gas are supplied as material gas, and the p-type semiconductor layer 14 is formed.

(f) Next, after forming the first metal layer 20 that is composed of Ti layers, and the second metal layer 22 that is composed of Au layers on the upper part of the p-type semiconductor layer 14 by vacuum evaporation, sputtering technology, etc., pattern so that it may have the first pattern width W1.

(g) Next, after forming the transparent electrode layer 24 and patterning, form the opening, which has the second pattern width W2 on the second metal layer 22. As the transparent electrode layer 24, one of the ZnO, and the ZnO containing ITO or indium can be used, for example. Furthermore, it may perform impurities doping of the n-type impurities, such as Ga or Al, at high concentration to about $1 \times 10^{19}$ to $5 \times 10^{21}$ cm$^{-3}$.

(h) Next, after form the insulating film 26 so that the transparent electrode layer 24 may be covered, and patterning, form the opening which has the third pattern width W3 on the second metal layer 22.

(i) Next, form the reflective stacked film 28 reflected toward the wavelength λ of the light, which emits on the insulating film 26 by vacuum evaporation, sputtering technology, etc.

(j) Next, perform mesa etching and remove even of the halfway of the reflective stacked film 28 and the p-type semiconductor layer 14 to the n-type semiconductor layer 12 by using etching technology, such as RIE (Reactive Ion Etching), and expose the surface of the n-type semiconductor layer 12.

(k) Next, form the fifth metal layer 33 and the third Ni layer 34 on the surface of the exposed n-type semiconductor layer 12 by vacuum evaporation, sputtering technology, etc.

(l) Next, form the opening, which has the third pattern width W3 on the second metal layer 22 after patterning the insulating film 26 and the reflective stacked film 28.

(m) Next, form the third metal layer 30 which is composed of Ti layers, for example on the second metal layer 22 of the opening which has the reflective stacked film 28 and the third pattern width W3, and form simultaneously the sixth metal layer 35 which is composed of Ti layers, for example by vacuum evaporation, sputtering technology, etc. on the third Ni layer 34.

(n) Next, form the fourth metal layer 32 which is composed of Au layers, for example on the third metal layer 30, form the seventh metal layer 36 which is composed of Au layers, for example is simultaneously by vacuum evaporation, sputtering technology, etc. on the sixth metal layer 35, and then the semiconductor light emitting device shown in FIG. 2 or FIG. 4 is completed.

According to the first embodiment of the present invention, the semiconductor light emitting device and the fabrication method for the semiconductor light emitting device whose manufacturing yield improved and which improves outward luminous efficiency can be provided by providing the structure which extends and forms the transparent electrode layer on the p-type semiconductor layer, and covers the transparent electrode layer with the insulating film.

Second Embodiment

Figure 7:
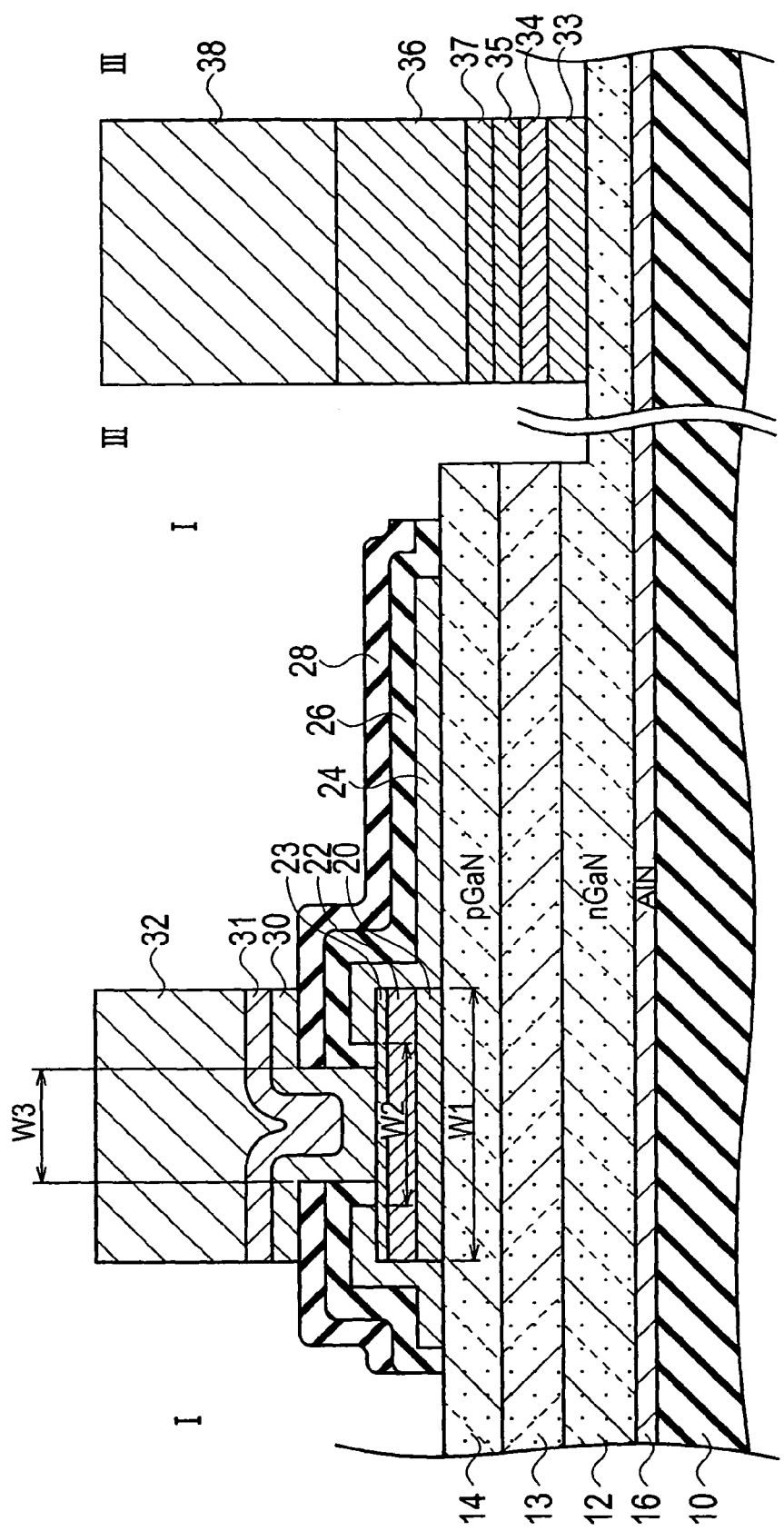
FIG. 7 shows a section structure of the semiconductor light emitting device according to the second embodiment of the present invention, and is a schematic cross-sectional configuration chart taken in the lines I-I and III-III of FIG. 3.
Figure 8:
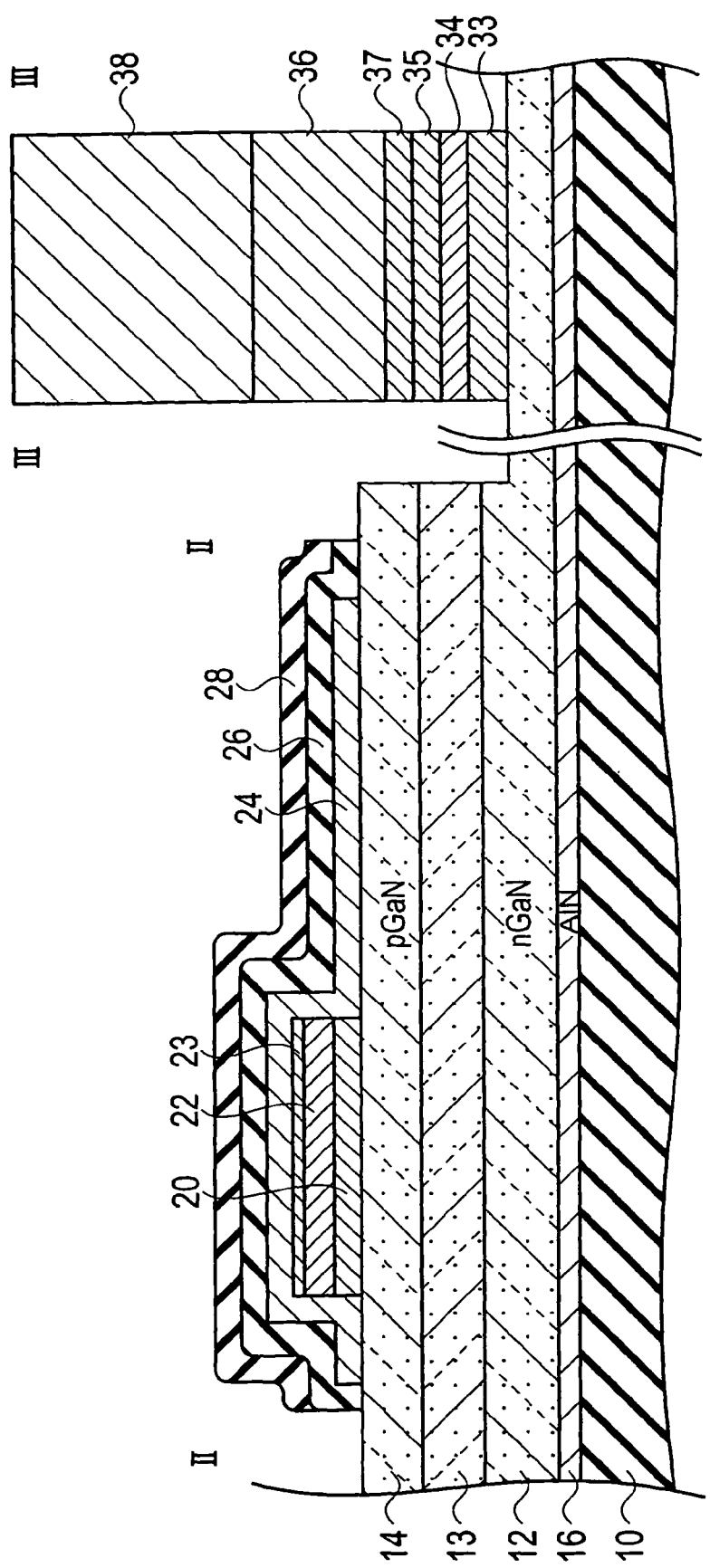
FIG. 8 shows a section structure of the semiconductor light emitting device according to the second embodiment of the present invention, and is a schematic cross-sectional configuration chart taken in the line II-II of FIG. 4, or the line III-III of FIG. 3.

As shown in FIG. 7 to FIG. 8, a semiconductor light emitting device according to a second embodiment of the present invention includes a substrate 10; an n-type semiconductor layer 12 which is placed on the substrate 10, and is doped with the n-type impurity; an active layer 13 placed on the n-type semiconductor layer 12; a p-type semiconductor layer 14 which is placed on the active layer 13, and is doped with the p-type impurity; a first metal layer 20 which is placed on the p-type semiconductor layer 14, and includes a first pattern width W1; a second metal layer 22 placed on the first metal layer 20; a first Ni layer 23 placed on the second metal layer 22; a transparent electrode layer 24 which is placed on the first metal layer 23 and the p-type semiconductor layer 14, and has an opening patterned with a second pattern width W2 on the first metal layer 23; an insulating film 26 which is placed on the transparent electrode layer 24 and the first Nil layer 23, and has an opening patterned with third pattern width W3 on the first Ni layer 23; a reflective stacked film 28 which is placed on the insulating film 26, and has an opening patterned with third pattern width W3 on the first Ni layer 23; a third metal layer 30 placed on the first Ni layer 23 of an opening patterned with the reflective stacked film 28 and third pattern width W3; a second Ni layer 31 placed on the third metal layer 30; and a fourth metal layer 32 placed on the second Ni layer 31.

Moreover, as shown in FIG. 7 to FIG. 8, the semiconductor light emitting device according to the second embodiment of the present invention includes: a fifth metal layer 33 placed on the n-type semiconductor layer 12 which removes a part of the p-type semiconductor layer 14, the active layer 13, and the n-type semiconductor layer 12 by etching; a third Ni layer 34 placed on the fifth metal layer 33; a sixth metal layer 35 placed on the third Ni layer 34; and a seventh metal layer 36 placed on the sixth metal layer 35.

The configuration of each part is substantially the same as the configuration of the first embodiment. Therefore, the detailed description is omitted.

(Fabrication Method)

As shown in FIG. 7 to FIG. 8, a fabrication method of the semiconductor light emitting device according to the second embodiment of the present invention includes the step of forming the n-type semiconductor layer 12 doped with the n-type impurity is performed on the substrate 10; the step for forming the active layer 13 on the n-type semiconductor layer 12; the step of forming the p-type semiconductor layer 14 doped with the p-type impurity on the active layer 13; the step of forming the first metal layer 20 on the p-type semiconductor layer 14; the step of forming the second metal layer 22 on the first metal layer 20; the step of forming the first Ni layer 23 on the second metal layer 22; the step of patterning the first metal layer 20, the second metal layer 22, and the first Ni layer 23 with the first pattern width W1; the step of forming the opening patterned with the second pattern width W2 on the first Ni layer 23 after forming the transparent electrode layer 24 on the first Ni layer 23 and the p-type semiconductor layer 14; the step of forming the insulating film 26 on the transparent electrode layer 24 and the first Ni layer 23; the step of forming the reflective stacked film 28 on the insulating film 26; the step of forming the opening which has the third pattern width W3 on the first Ni layer 23 after patterning the insulating film 26 and the reflective stacked film 28; the step of forming the third metal layer 30 on the first Ni layer 23 of the opening which has the reflective stacked film 28 and the third pattern width W3; the step of forming the second Ni layer 31 on the third metal layer 30; and the step of forming the fourth metal layer 32 on the second Ni layer 31.

Moreover, as shown in FIG. 7 to FIG. 8, the fabrication method of the semiconductor light emitting device according to the second embodiment of the present invention includes the step of forming the fifth metal layer 33 on the n-type semiconductor layer 12 which removed a part of the p-type semiconductor layer 14, the active layer 13, and the n-type semiconductor layer 12 by etching; the step of forming the third Ni layer 34 on the fifth metal layer 33; the step of forming the sixth metal layer 35 on the third Ni layer 34; and the step of forming the seventh metal layer 36 on the sixth metal layer 35.

Each step is substantially the same as the first embodiment. Therefore, the detailed description is omitted.

According to the second embodiment of the present invention, the semiconductor light emitting device and the fabrication method for the semiconductor light emitting device whose manufacturing yield improved and which improves outward luminous efficiency can be provided by providing the structure which extends and forms the transparent electrode layer on the p-type semiconductor layer, and covers the transparent electrode layer with the insulating film.

Third Embodiment

Figure 9:
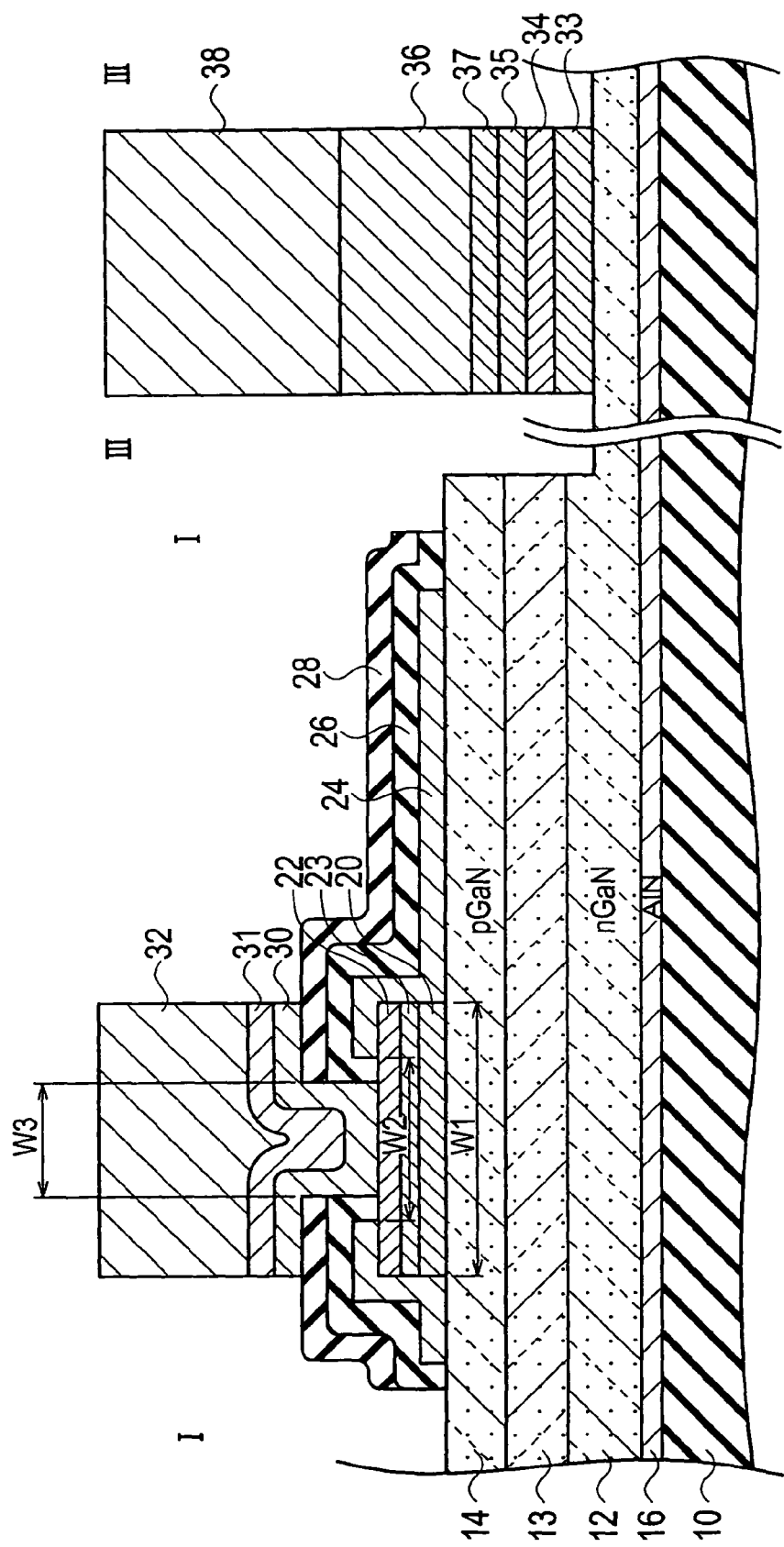
FIG. 9 shows a section structure of the semiconductor light emitting device according to the third embodiment of the present invention, and is a schematic cross-sectional configuration chart taken in the lines I-I and III-III of FIG. 3.
Figure 10:
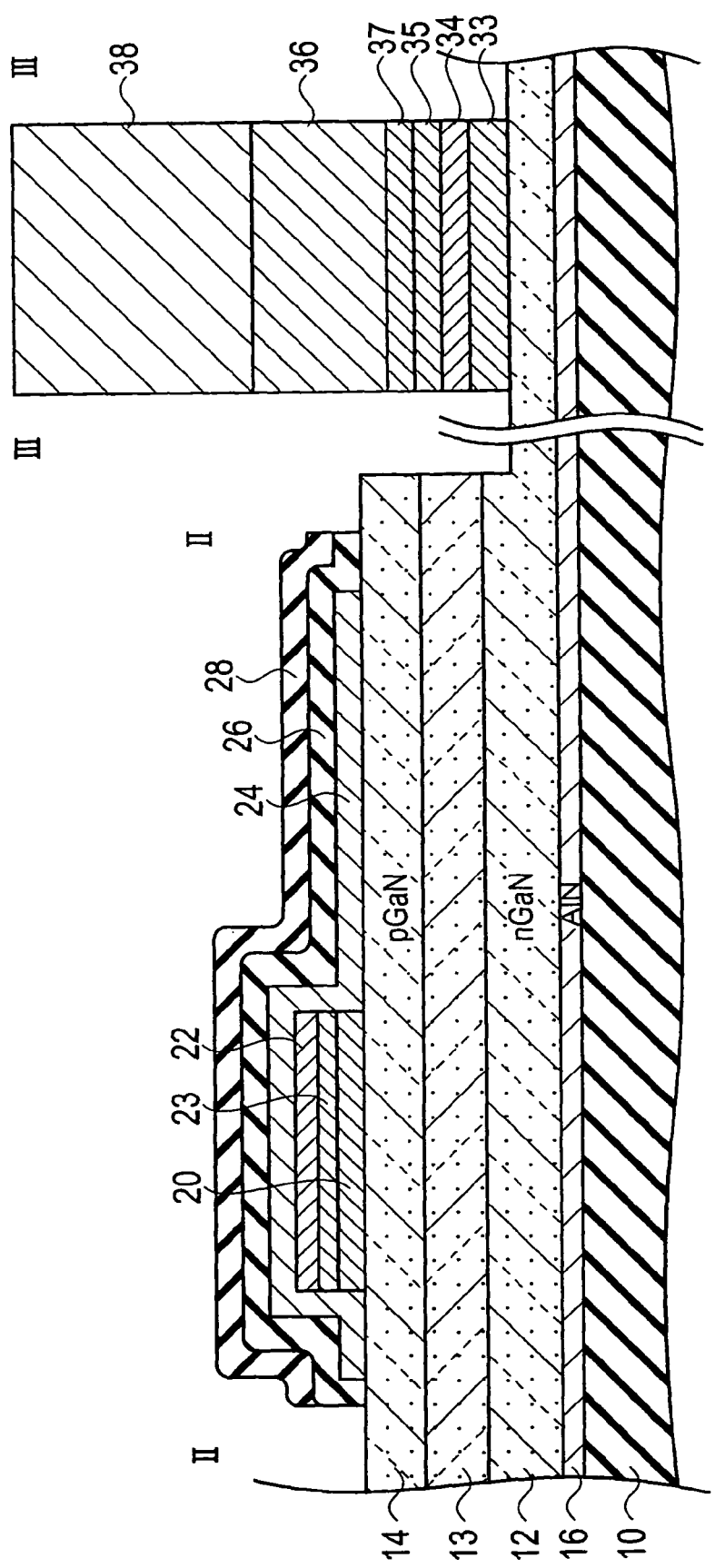
FIG. 10 shows a section structure of the semiconductor light emitting device according to the third embodiment of the present invention, and is a schematic cross-sectional configuration chart taken in the line II-II of FIG. 4, or the line III-III of FIG. 3.

As shown in FIG. 9 to FIG. 10, a semiconductor light emitting device according to a third embodiment of the present invention includes a substrate 10; an n-type semiconductor layer 12 which is placed on the substrate 10, and is doped with the n-type impurity; an active layer 13 placed on the n-type semiconductor layer 12; a p-type semiconductor layer 14 which is placed on the active layer 13, and is doped with the p-type impurity; a first metal layer 20 which is placed on the p-type semiconductor layer 14, and includes a first pattern width W1; a first Ni layer 23 placed on the first metal layer 20; a second metal layer 22 placed on the first Ni layer 23; a transparent electrode layer 24 which is placed on the second metal layer 22 and the p-type semiconductor layer 14, and has an opening patterned with a second pattern width W2 on the second metal layer 22; an insulating film 26 which is placed on the transparent electrode layer 24 and the second metal layer 22, and has an opening patterned with third pattern width W3 on the second metal layer 22; a reflective stacked film 28 which is placed on the insulating film 26, and has an opening patterned with third pattern width W3 on the second metal layer 22; a third metal layer 30 placed on the second metal layer 22 of an opening patterned with the reflective stacked film 28 and third pattern width W3; a second Ni layer 31 placed on the third metal layer 30; and a fourth metal layer 32 placed on the second Ni layer 31.

Moreover, as shown in FIG. 9 to FIG. 10, the semiconductor light emitting device according to the third embodiment of a present invention includes a fifth metal layer 33 placed on the n-type semiconductor layer 12 which removes a part of the p-type semiconductor layer 14, the active layer 13, and the n-type semiconductor layer 12 by etching; a third Ni layer 34 placed on the fifth metal layer 33; a sixth metal layer 35 placed on the third Ni layer 34; a fourth Ni layer 37 placed on the sixth metal layer 35; and a seventh metal layer 36 placed on the fourth Ni layer 37.

The configuration of each part is substantially the same as the configuration of the first embodiment. Therefore, the detailed description is omitted.

(Fabrication Method)

As shown in FIG. 9 to FIG. 10, a fabrication method of the semiconductor light emitting device according to the third embodiment of a present invention includes the step of forming the n-type semiconductor layer 12 doped with the n-type impurity on the substrate 10; the step for forming the active layer 13 on the n-type semiconductor layer 12; the step of forming the p-type semiconductor layer 14 doped with the p-type impurity on the active layer 13; the step of forming the first metal layer 20 on the p-type semiconductor layer 14; the step of forming the first Ni layer 23 on the first metal layer 20; the step of forming the second metal layer 22 on the first Ni layer 23; the step of patterning the first metal layer 20, the first Ni layer 23, and the second metal layer 22 with the first pattern width W1; the step of forming the opening patterned with the second pattern width W2 on the second metal layer 22 after forming the transparent electrode layer 24 on the second metal layer 22 and the p-type semiconductor layer 14; the step of forming the insulating film 26 on the transparent electrode layer 24 and the second metal layer 22; the step of forming the reflective stacked film 28 on the insulating film 26; the step of forming the opening which has the third pattern width W3 on the second metal layer 22 after patterning the insulating film 26 and the reflective stacked film 28; the step of forming the third metal layer 30 on the second metal layer 22 of the opening which has the reflective stacked film 28 and the third pattern width W3; the step of forming the second Ni layer 31 on the third metal layer 30; and the step of forming the fourth metal layer 32 on the second Ni layer 31.

Moreover, as shown in FIG. 9 to FIG. 10, the fabrication method of the semiconductor light emitting device according to the third embodiment of a present invention includes: the step of forming the fifth metal layer 33 on the n-type semiconductor layer 12 which removed a part of the p-type semiconductor layer 14, the active layer 13, and the n-type semiconductor layer 12 by etching; the step of forming the third Ni layer 34 on the fifth metal layer 33; the step of forming the sixth metal layer 35 on the third Ni layer 34; the step of forming the fourth Ni layer 37 on the sixth metal layer 35; and the step of forming the seventh metal layer 36 on the fourth Ni layer 37.

Each step is substantially the same as the first embodiment. Therefore, the detailed description is omitted.

According to the third embodiment of the present invention, the semiconductor light emitting device and the fabrication method for the semiconductor light emitting device whose manufacturing yield improved and which improves outward luminous efficiency can be provided by providing the structure which extends and forms the transparent electrode layer on the p-type semiconductor layer, and covers the transparent electrode layer with the insulating film.

Fourth Embodiment

Figure 13:
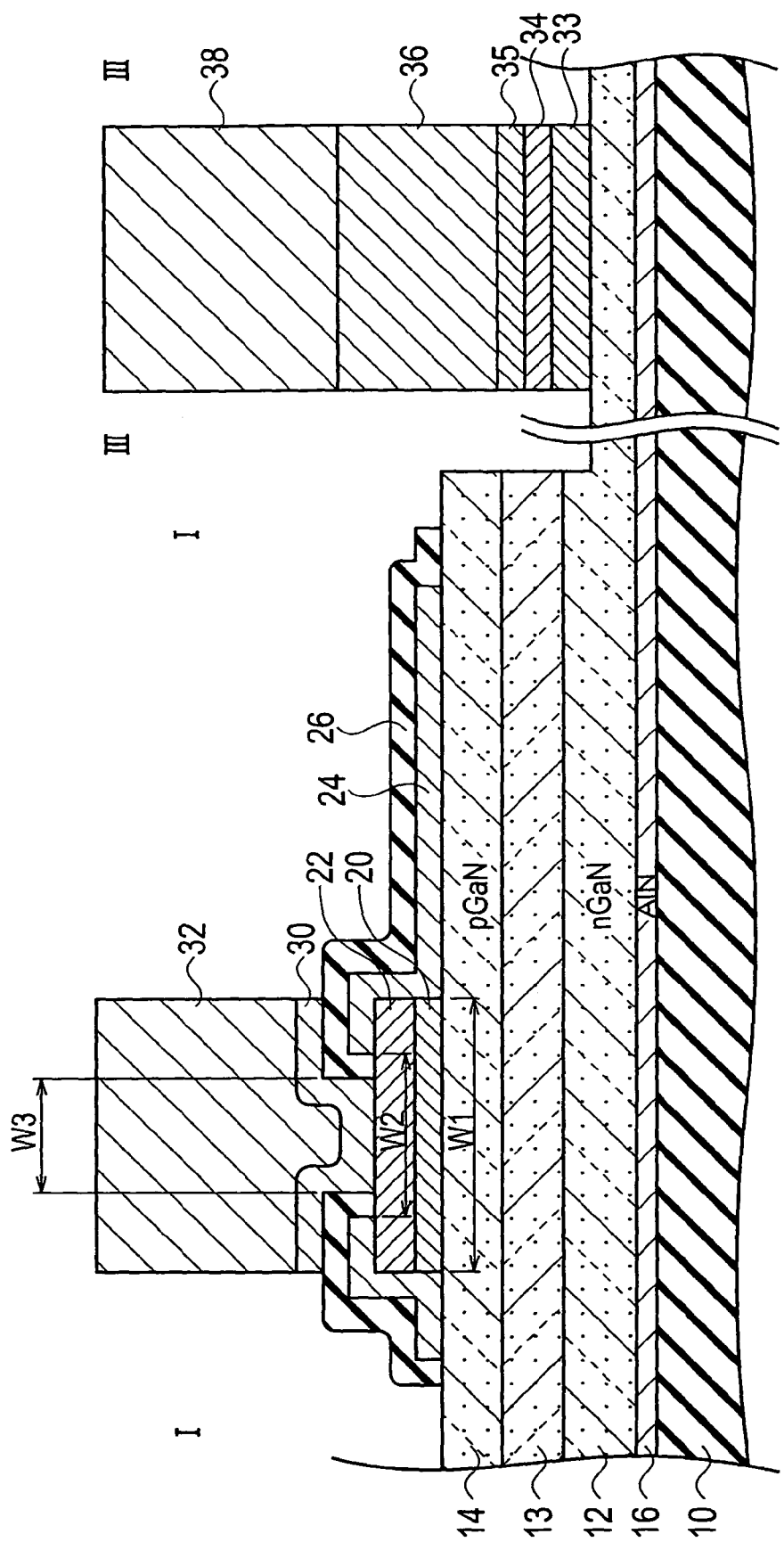
FIG. 13 shows a section structure of a semiconductor light emitting device according to a fourth embodiment of the present invention, and is a schematic cross-sectional configuration chart corresponding to a structure which omits a reflective stacked film 28 in FIG. 1.
Figure 14:
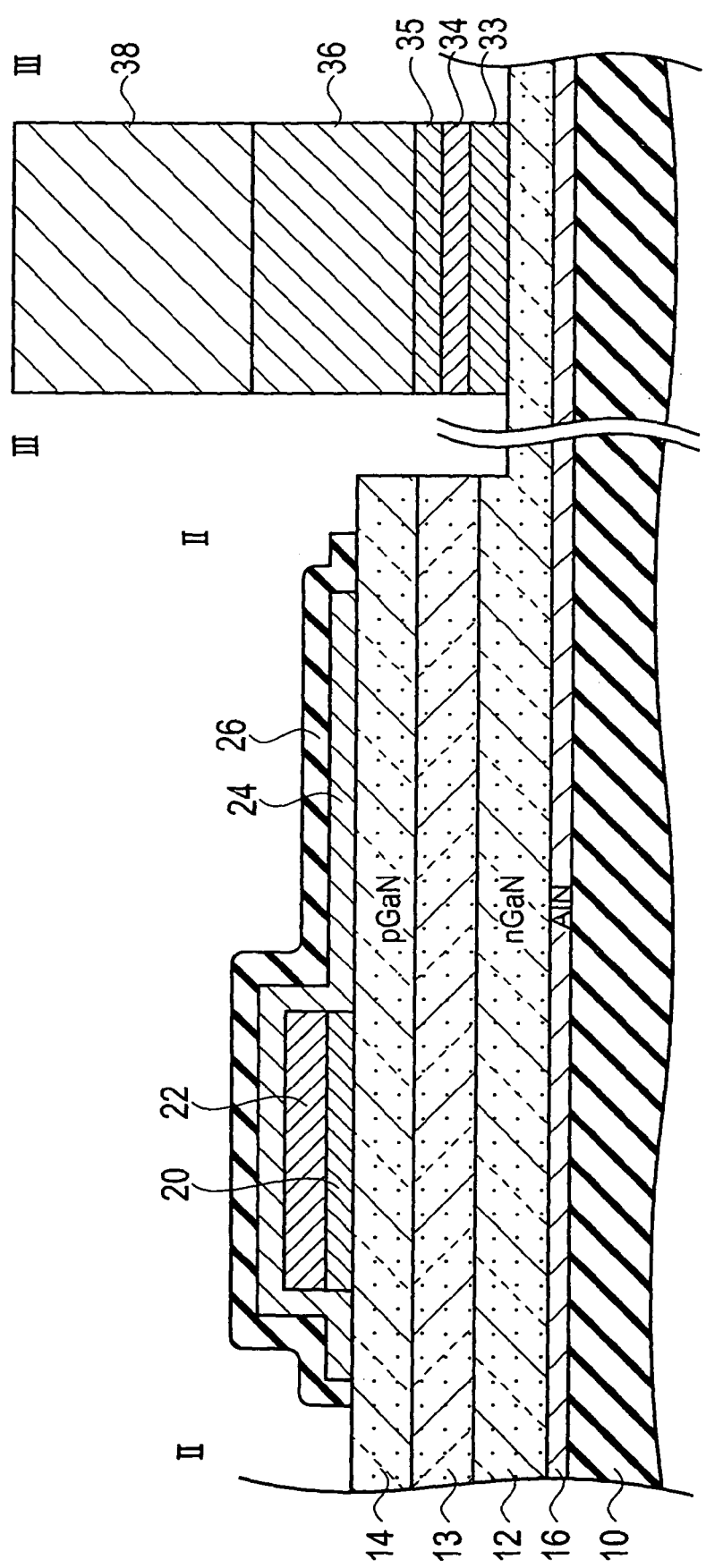
FIG. 14 shows a section structure of the semiconductor light emitting device according to the fourth embodiment of the present invention, and is a schematic cross-sectional configuration chart corresponding to a structure which omits a reflective stacked film 28 in FIG. 2.

A schematic section structure corresponding to the structure which is the section structure of a semiconductor light emitting device according to a fourth embodiment, and omits the reflective stacked film 28 in FIG. 1 and FIG. 2 is expressed as shown in FIG. 13 and FIG. 14. Also in the fourth embodiment, the configuration except the reflective stacked film 28 is the same as that of the first embodiments.

Fifth Embodiment

Figure 15:
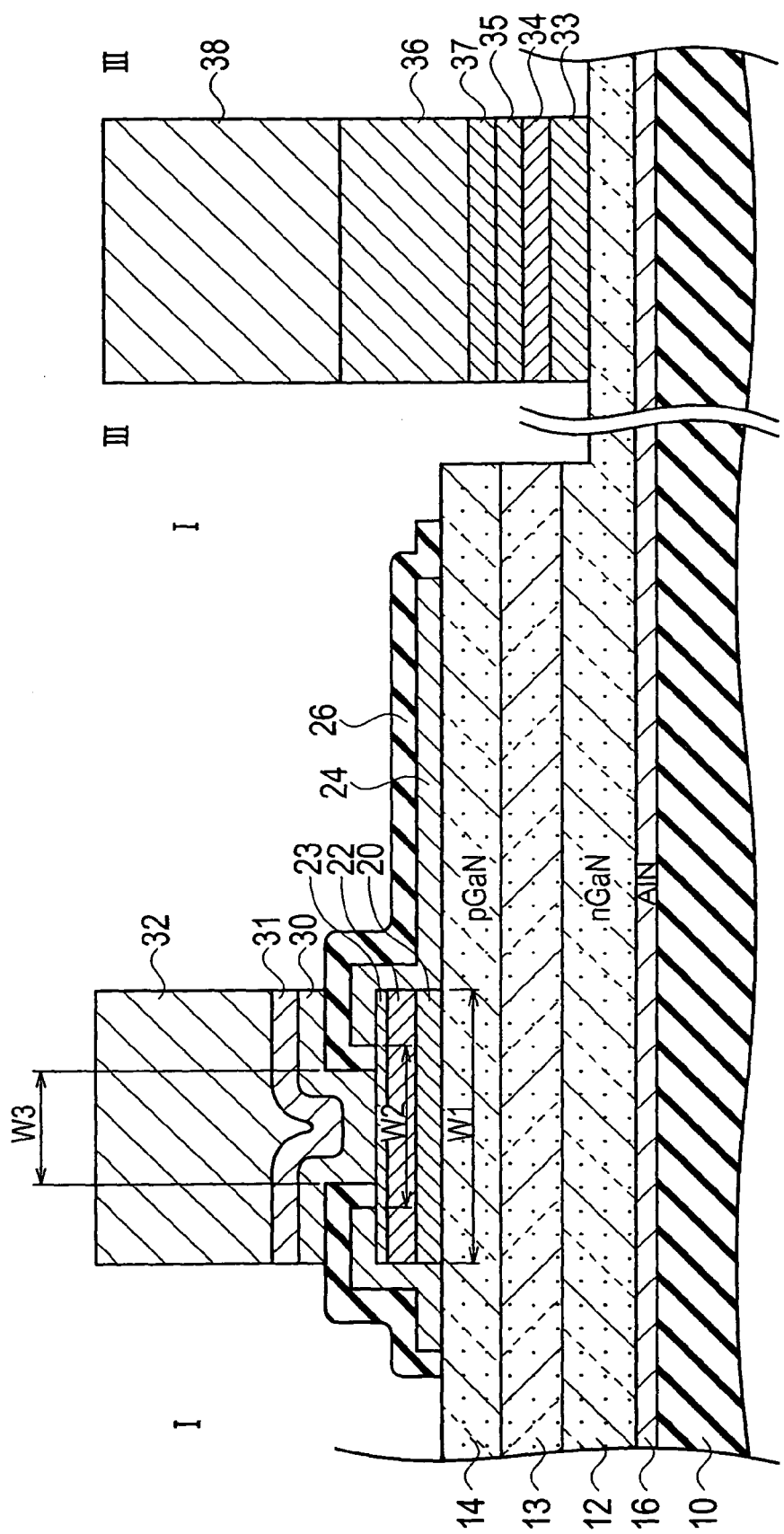
FIG. 15 shows a section structure of a semiconductor light emitting device according to a fifth embodiment of the present invention, and is a schematic cross-sectional configuration chart corresponding to a structure which omits a reflective stacked film 28 in FIG. 7.
Figure 16:
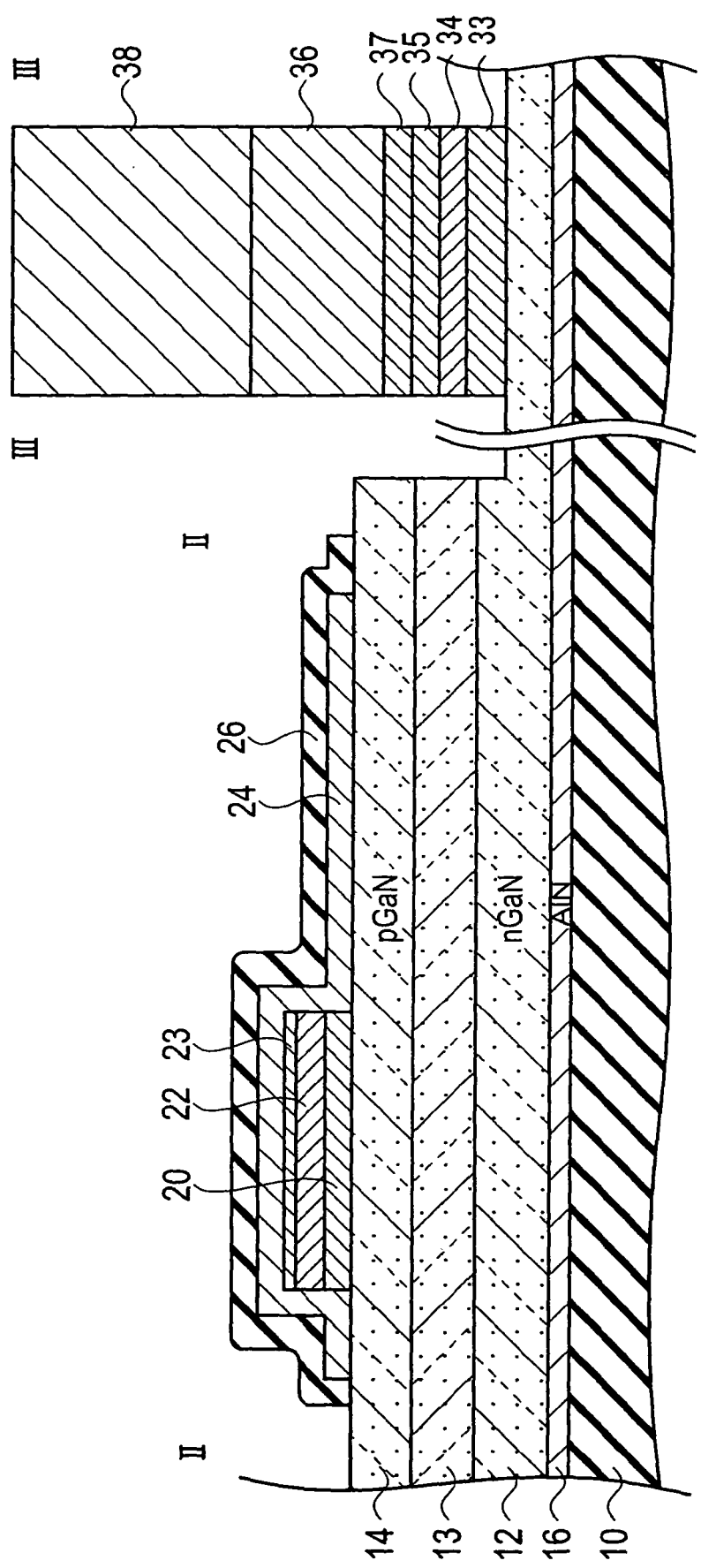
FIG. 16 shows a section structure of the semiconductor light emitting device according to the fifth embodiment of the present invention, and is a schematic cross-sectional configuration chart corresponding to a structure which omits a reflective stacked film 28 in FIG. 8.

A schematic section structure corresponding to the structure which is the section structure of a semiconductor light emitting device according to a fifth embodiment, and omits the reflective stacked film 28 in FIG. 7 and FIG. 8 is expressed as shown in FIG. 15 and FIG. 16. Also in the fifth embodiment, the configuration except the reflective stacked film 28 is the same as that of the second embodiments.

Sixth Embodiment

Figure 17:
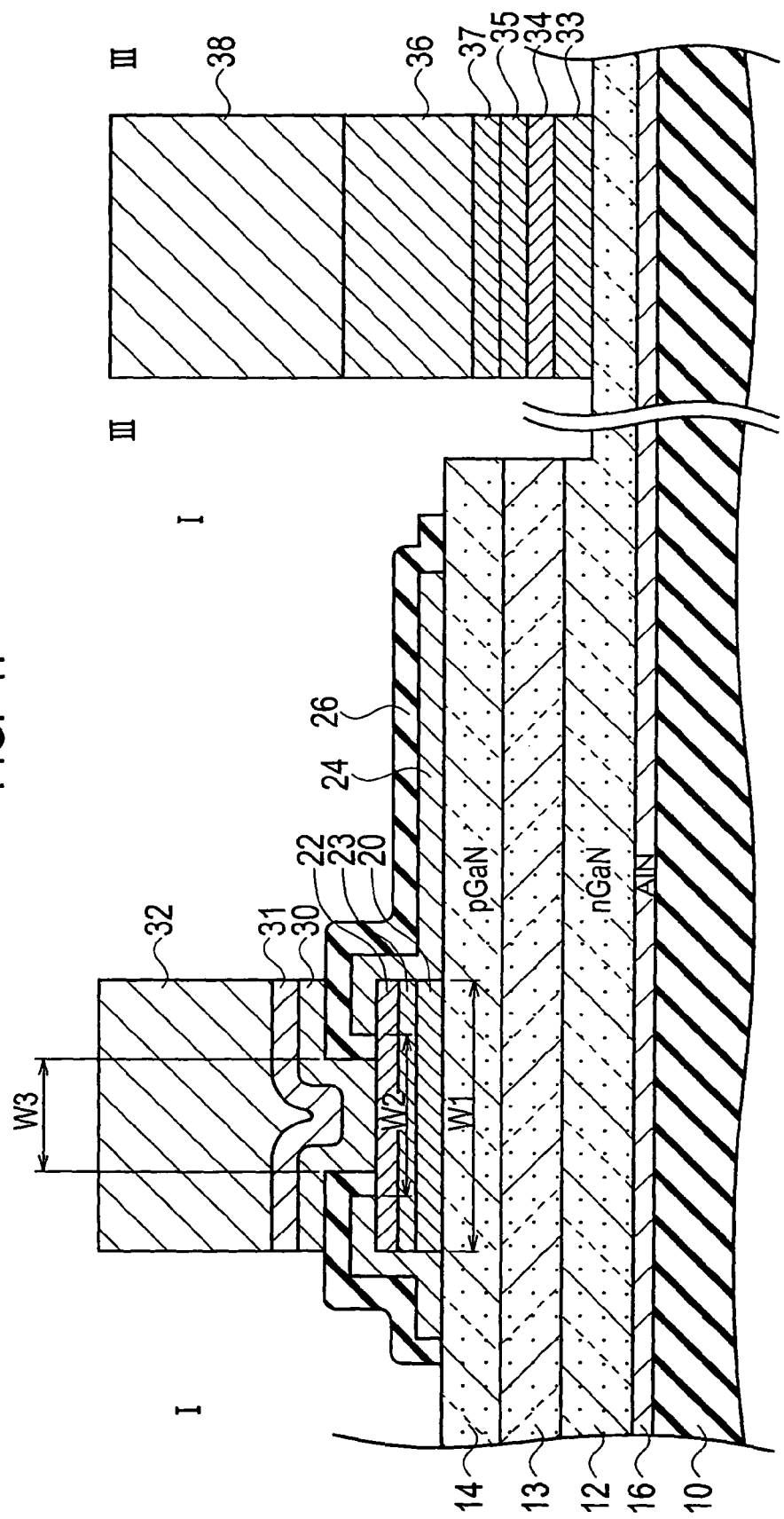
FIG. 17 shows a section structure of a semiconductor light emitting device according to a sixth embodiment of the present invention, and is a schematic cross-sectional configuration chart corresponding to a structure which omits a reflective stacked film 28 in FIG. 9.
Figure 18:
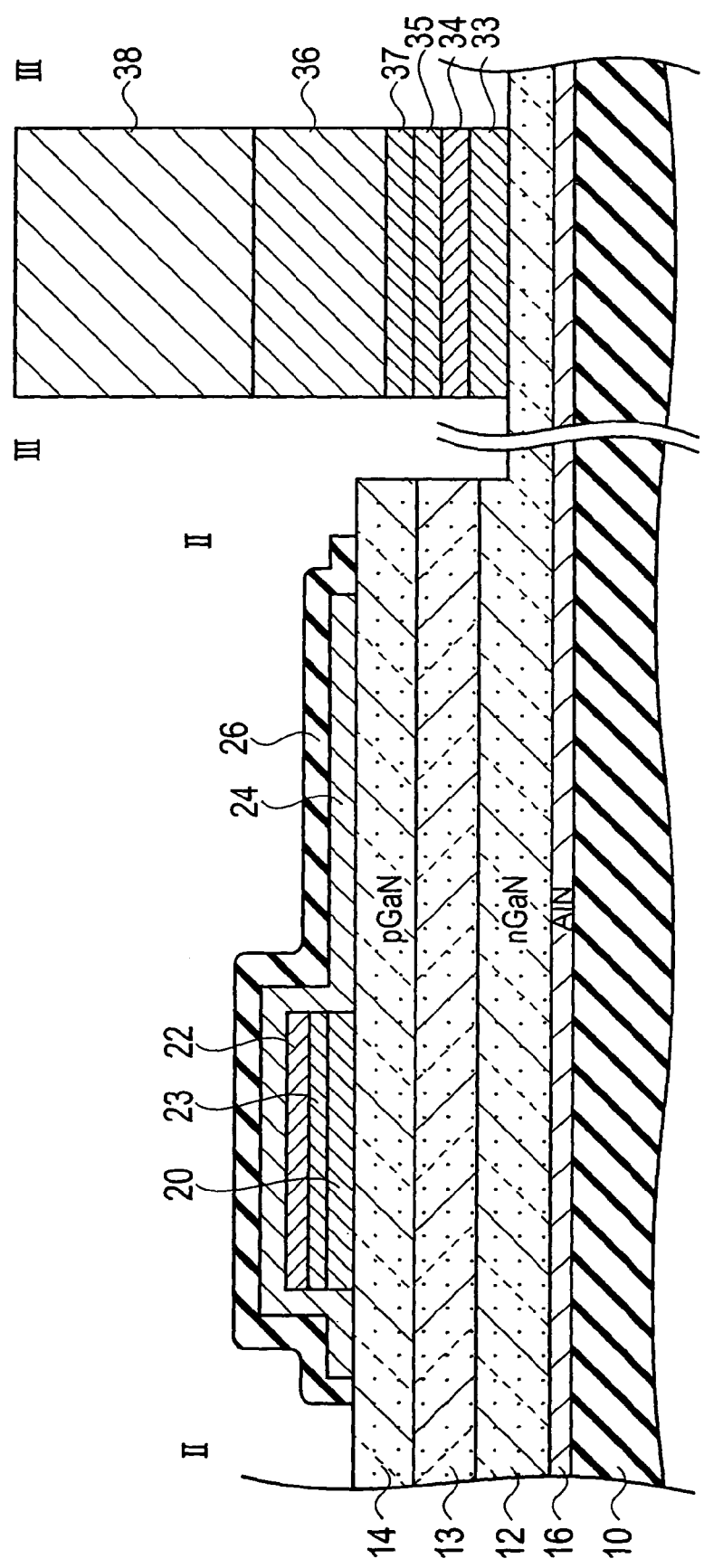
FIG. 18 shows a section structure of the semiconductor light emitting device according to the sixth embodiment of the present invention, and is a schematic cross-sectional configuration chart corresponding to a structure which omits a reflective stacked film 28 in FIG. 10.

A schematic section structure corresponding to the structure which is the section structure of a semiconductor light emitting device according to a sixth embodiment, and omits the reflective stacked film 28 in FIG. 9 and FIG. 10 is expressed as shown in FIG. 17 and FIG. 18. Also in the sixth embodiment, the configuration except the reflective stacked film 28 is the same as that of the third embodiments.

In particular, also in the structure, which is not provided with the reflective stacked film 28, the flip chip structure can be provided and the light can be extracted from the substrate side.

The configuration of each part except the reflective stacked film 28 is substantially the same as the first to third embodiments. Therefore, the detailed description is omitted.

Moreover, each step of fabrication methods except the fabricating step of the reflective stacked film 28 is substantially the same as the first to third embodiment. Therefore, the detailed description is omitted.

According to the fourth to sixth embodiments of the present invention, the semiconductor light emitting device and the fabrication method for the semiconductor light emitting device whose manufacturing yield improved and which improves outward luminous efficiency can be provided by providing the structure which extends and forms the transparent electrode layer on the p-type semiconductor layer, and covers the transparent electrode layer with the insulating film.

Other Embodiments

While the present invention is described in accordance with the aforementioned first through sixth embodiments and those modified examples, it should not be understood that the description and drawings that configure part of this disclosure are to limit the present invention. This disclosure makes clear a variety of alternative embodiments, working examples, and operational techniques for those skilled in the art.

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

Thus, the present invention includes various embodiments etc. which have not been described in this specification.

INDUSTRIAL APPLICABILITY

The semiconductor light emitting device of the present invention can be applied to the whole of the nitride based semiconductor light emitting device, and can be applied as an LD element for a pickup of CD, DVD, DVD-ROM, CD-RW in which data write is possible, etc., an LD element for printers, and an LD element for optical communications.

What is claimed is:

1. A semiconductor light emitting device comprising:
   a substrate;
   an n-type semiconductor layer which is placed on the substrate, and is doped with the n-type impurity;
   an active layer placed on the n-type semiconductor layer;
   a p-type semiconductor layer which is placed on the active layer, and is doped with the p-type impurity;
   a first metal layer which is placed on the p-type semiconductor layer, and has a first pattern width;
   a second metal layer placed on the first metal layer;
   a transparent electrode layer which is placed on the second metal layer and the p type semiconductor layer, and has an opening patterned with a second pattern width on the second metal layer;
   an insulating film which is placed on the transparent electrode layer and the second metal layer, and has an opening patterned with the third pattern width on the second metal layer;
   a third metal layer placed on the second metal layer of an opening patterned with the insulating film and the third pattern width; and
   a fourth metal layer placed on the third metal layer.

2. The semiconductor light emitting device according to claim 1 further comprising
   a reflective stacked film which is placed between the third metal layer on the insulating film and the insulating film, and has an opening patterned with the third pattern width on the second metal layer.

3. A semiconductor light emitting device comprising:
   a substrate;
   an n-type semiconductor layer which is placed on the substrate, and is doped with the n-type impurity;
   an active layer placed on the n-type semiconductor layer;
   a p-type semiconductor layer which is placed on the active layer, and is doped with the p-type impurity;
   a first metal layer which is placed on the p-type semiconductor layer, and has a first pattern width;
   a second metal layer placed on the first metal layer;
   a first Ni layer placed on the second metal layer;
   a transparent electrode layer which is placed on the first metal layer and the p-type semiconductor layer, and has an opening patterned with a second pattern width on the first metal layer;
   an insulating film which is placed on the transparent electrode layer and the first Ni1 layer, and has an opening patterned with third pattern width on the first Ni layer;
   a third metal layer placed on the first Ni layer of an opening patterned with the insulating film and the third pattern width;
   a second Ni layer placed on the third metal layer; and
   a fourth metal layer placed on the second Ni layer.

4. The semiconductor light emitting device according to claim 3 further comprising
   a reflective stacked film which is placed between the first Ni layer on the insulating film and the insulating film, and has an opening patterned with the third pattern width on the second metal layer.

5. A semiconductor light emitting device comprising:
   a substrate;
   an n-type semiconductor layer which is placed on the substrate, and is doped with the n-type impurity;
   an active layer placed on the n-type semiconductor layer;
   a p-type semiconductor layer which is placed on the active layer, and is doped with the p-type impurity;
   a first metal layer which is placed on the p-type semiconductor layer, and has a first pattern width;
   a first Ni layer placed on the first metal layer;
   a second metal layer placed on the first Ni layer;
   a transparent electrode layer which is placed on the second metal layer and the p type semiconductor layer, and has an opening patterned with a second pattern width on the second metal layer;
   an insulating film which is placed on the transparent electrode layer and the second metal layer, and has an opening patterned with third pattern width on the second metal layer;
   a third metal layer placed on the second metal layer of an opening patterned with the insulating film and the third pattern width;
   a second Ni layer placed on the third metal layer; and
   a fourth metal layer placed on the second Ni layer.

6. The semiconductor light emitting device according to claim 5 further comprising a reflective stacked film which is placed between the third metal layer on the insulating film and the insulating film, and has an opening patterned with the third pattern width on the second metal layer.

7. The semiconductor light emitting device according to claim 1 further comprising:
a fifth metal layer placed on the n-type semiconductor layer which removes a part of the p-type semiconductor layer, the active layer, and the n-type semiconductor layer by etching;
a third Ni layer placed on the fifth metal layer;
a sixth metal layer placed on the third Ni layer; and
a seventh metal layer placed on the sixth metal layer.

8. The semiconductor light emitting device according to claim 7 further comprising
a fourth Ni layer placed between the sixth metal layer and the seventh metal layer.

9. The semiconductor light emitting device according to claim 7, wherein
the fifth metal layer is formed by an Al layer, the sixth metal layer is formed by a Ti layer, and the seventh metal layer is formed by an Au layer.

10. The semiconductor light emitting device according to claim 1, wherein
the semiconductor light emitting device includes a flip chip structure, and light is extracted from the substrate side.

11. The semiconductor light emitting device according to claim 7, wherein
the plane pattern configuration has a rectangular form in which a long side has the length of 2.0 to 2.8 times rather than a short side, and a first pad electrode composed of the fourth metal layer and a second pad electrode composed of the seventh metal layer mutually placed in the opposite side on both sides of a center line which bisects the long side in a parallel direction of the short side are provided.

12. The semiconductor light emitting device according to claim 11, wherein
the plane pattern configuration has a substantially circular curve profile between the second pad electrode and the transparent electrode, the interval has substantially constant distance, and widths La and Lb in parallel to the short side direction of said first pad electrode and the second pad electrode has a relationship of La>Lb.

13. The semiconductor light emitting device according to claim 7, wherein
in the plane pattern configuration, the fifth metal layer includes a first metallic wiring extended to and placed on the end of one side and the central part of one side among the four sides by which the second pad electrode composed of the seventh metal layer is placed, and second metallic wirings of n pieces (where n is even number) turned 90 degrees substantially from the first metallic wiring in the direction of the first pad electrode composed of the fourth metal layer, and
the first metal layer includes a third metallic wiring extended to and placed on all the sides of the end of one side from the central part of one side where the first pad electrode is placed among the four sides which oppose the second pad electrode, and fourth metallic wirings of (n+1) pieces (where n is even number) turned 90 degrees substantially in the direction of the second pad electrode from the third metallic wiring.

14. The semiconductor light emitting device according to claim 7, wherein
in the plane pattern configuration, the fifth metal layer includes a first metallic wiring extended to and placed on the end of one side and all the one side approximately sides among the four sides by which the second pad electrode composed of the seventh metal layer is placed, and second metallic wirings of n pieces (where n is even number) turned 90 degrees substantially from the first metallic wiring in the direction of the first pad electrode composed of the fourth metal layer, and
the first metal layer includes a third metallic wiring extended to and placed on all the sides of the end of one side from the central part of one side where the first pad electrode is placed among the four sides which oppose the second pad electrode and fourth metallic wirings of (n+1) pieces (where n is even number) turned 90 degrees substantially in the direction of the second pad electrode from the third metallic wiring.

15. The semiconductor light emitting device according to claim 13, wherein
the second metallic wiring of n pieces and the forth metallic wiring of (n+1) pieces (where n is even number) are placed by turns in the shape of teeth of a comb, and have a relationship of L1<L2<L3, where the distance between the fourth metallic wiring and the transparent electrode layers near the second metallic wiring is L1, the distance between the transparent electrode layer near the second metallic wiring and the fourth metallic wiring of the central part is L2, and the distance between the transparent electrode layer near the second metallic wiring and the third metallic wiring is L3.

16. The semiconductor light emitting device according to claim 15, wherein
in the plane pattern configuration, the first metal layer has a relationship of L11<L1, where the distance between the fourth metallic wirings of two pieces nearest the four sides of a peripheral part and the transparent electrode is L11, and
the first metal layer has a relationship of L22=L2, where the distance of the fourth metallic wiring and the transparent electrode is L22, except the peripheral part.

17. The semiconductor light emitting device according to claim 13, wherein
the first pad electrode and the second pad electrode are placed on the end of two sides at a rate of one piece every about 300 to 500 micrometers in parallel among the four sides which oppose mutually.

18. A fabrication method for a semiconductor light emitting device comprising:
forming an n-type semiconductor layer doped with the n-type impurity on a substrate;
forming an active layer on the n-type semiconductor layer;
forming a p-type semiconductor layer doped with the p-type impurity on the active layer;
forming a first metal layer on the p-type semiconductor layer;
forming a second metal layer on the first metal layer;
patterning the first metal layer and the second metal layer with a first pattern width;
forming an opening patterned with a second pattern width on the second metal layer after forming a transparent electrode layer on the second metal layer and the p-type semiconductor layer;
forming an insulating film on the transparent electrode layer and the second metal layer;
forming an opening having a third pattern width on the second metal layer after patterning the insulating film;
forming a third metal layer on the second metal layer of the opening having the third pattern width; and
forming a fourth metal layer on the third metal layer.

19. The fabrication method for a semiconductor light emitting device according to claim 18 further comprising forming a reflective stacked film on the insulating film.

20. A fabrication method for a semiconductor light emitting device comprising:

forming an n-type semiconductor layer doped with the n-type impurity on a substrate;

forming an active layer on the n-type semiconductor layer;

forming a p-type semiconductor layer doped with the p-type impurity on the active layer;

forming a first metal layer on the p-type semiconductor layer;

forming a second metal layer on the first metal layer;

forming first Ni layer on the second metal layer;

patterning the first metal layer, the second metal layer, and the first Ni layer with a first pattern width;

forming an opening patterned with a second pattern width on the first Ni layer after forming a transparent electrode layer on the first Ni layer and the p-type semiconductor layer;

forming an insulating film on the transparent electrode layer and the first Ni layer;

forming an opening having a third pattern width on the first Ni layer after patterning the insulating film;

forming a third metal layer on the first Ni layer of the opening having the third pattern width;

forming a second Ni layer on the third metal layer; and forming a fourth metal layer on the second Ni layer.

21. The fabrication method for a semiconductor light emitting device according to claim 20 further comprising forming a reflective stacked film on the insulating film.

22. A fabrication method for a semiconductor light emitting device comprising:

forming an n-type semiconductor layer doped with the n-type impurity on a substrate;

forming an active layer on the n-type semiconductor layer;

forming a p-type semiconductor layer doped with the p-type impurity on the active layer;

forming a first metal layer on the p-type semiconductor layer;

forming a first Ni layer on the first metal layer;

forming a second metal layer on the first Ni layer;

patterning the first metal layer, the first Ni layer, and the second metal layer with a first pattern width;

forming an opening patterned with a second pattern width on the second metal layer after forming a transparent electrode layer on the second metal layer and the p-type semiconductor layer;

forming an insulating film on the transparent electrode layer and the second metal layer;

forming an opening having a third pattern width on the second metal layer after patterning the insulating film;

forming a third metal layer on the second metal layer of the opening having the third pattern width;

forming a second Ni layer on the third metal layer; and forming a fourth metal layer on the second Ni layer.

23. The fabrication method for a semiconductor light emitting device according to claim 22 further comprising forming a reflective stacked film on the insulating film.

24. The fabrication method for a semiconductor light emitting device according to claim 18 further comprising:

forming a fifth metal layer on the n-type semiconductor layer which removed a part of the p-type semiconductor layer, the active layer, and the n-type semiconductor layer by etching;

forming a third Ni layer on the fifth metal layer;

forming a sixth metal layer on the third Ni layer; and forming a seventh metal layer on the sixth metal layer.

25. The fabrication method for a semiconductor light emitting device according to claim 24 further comprising forming a fourth Ni layer between the sixth metal layer and the seventh metal layer.

26. The fabrication method for a semiconductor light emitting device according to claim 24, wherein the fifth metal layer is formed by an Al layer, the sixth metal layer is formed by a Ti layer, and the seventh metal layer is formed by an Au layer.

27. The fabrication method for a semiconductor light emitting device according to claim 18, wherein the first metal layer and the third metal layer are formed by a Ti layer, and the second metal layer and the fourth metal layer are formed by an Au layer.

* * * * *